United States Patent [19]
Rim et al.

[11] Patent Number: 5,557,271
[45] Date of Patent: Sep. 17, 1996

[54] VARIABLE LENGTH CODER AND VARIABLE LENGTH DECODER

[75] Inventors: Chai Y. Rim; Seong W. Hong, both of Seoul, Rep. of Korea

[73] Assignee: Goldstar Co., Ltd., Seoul, Rep. of Korea

[21] Appl. No.: 309,192

[22] Filed: Sep. 20, 1994

[30] Foreign Application Priority Data

Sep. 23, 1993 [KR] Rep. of Korea ............... 19512/1993
Sep. 23, 1993 [KR] Rep. of Korea ............... 19513/1993

[51] Int. Cl.$^6$ .................................................. H03M 7/40
[52] U.S. Cl. ........................................................ 341/67
[58] Field of Search ................................ 341/67, 60, 63, 341/64, 65

[56] References Cited

U.S. PATENT DOCUMENTS

| | | |
|---|---|---|
| 4,502,111 | 2/1985 | Riffe et al. . |
| 5,060,242 | 10/1991 | Arbeiter . |
| 5,173,695 | 12/1992 | Sun et al. . |
| 5,309,156 | 5/1994 | Fujiyama ........................ 341/67 |
| 5,343,195 | 8/1994 | Cooper . |
| 5,436,626 | 7/1995 | Fujiwara et al. ................ 341/67 |

OTHER PUBLICATIONS

Soviet Inventions Illustrated, E1 Sec., Wk 8525, Jul. 31, 1985.

Primary Examiner—Brian K. Young
Attorney, Agent, or Firm—Birch, Stewart, Kolasch & Birch, LLP

[57] ABSTRACT

A variable length coder and a variable length decoder. The variable length coder comprises a plurality of shifters, each of which inputs a corresponding one of a plurality of codewords and a plurality of codelengths, rotates the corresponding codeword by a desired length for interconnection of the codewords and outputs masking bits designating a position of the corresponding codeword to be rotated, a first OR gate for ORing output codewords from the shifters, a second OR gate for ORing output masking bits from the shifters, a word/mask register for latching output codeword bits from the first OR gate when corresponding output masking bits from the second OR gate are enabled to "1", and an FIFO memory for storing an output of the word/mask register and outputting variable length-coded data. The variable length decoder comprises a data shifter for shifting input data in response to a previous codelength and a matching signal, a decoding circuit for discriminating a matched state of output data from the data shifter according to the previous codelength to generate a current codelength, the matching signal and a decoded word, and a shift controller for controlling a shifting amount of the data shifter in response to the current codelength and the matching signal from the decoding circuit and outputting the previous codelength.

15 Claims, 17 Drawing Sheets

| SHIFTER | SIGNAL \ TIME | t=0 | t=1 | t=2 | t=3 |
|---|---|---|---|---|---|
| <SHIFTER1> | S(401,404) | A1,2 | B1,6 | C1,10 | D1,10 |
| | S(402,405) LENGTH1,L2 | XXX,0,0,0 | A1,2,2,8 | B1,6,6,16 | C1,10,10,12 |
| | S(403,407,410) | XXX,0,0 | XXX,DEC1(0,0),0 | A1,DEC1(2,0) | B1,DEC1(6,10),32 |
| | W1,M1,S(412) | XXX,0,0 | XXX,0,0 | XXX,0,0 | ROT(A1,0), DEC1(2,0), DEC2(10) |
| <SHIFTER2> | S(401,404) | A2,8 | B2,16 | C2,12 | D2,2 |
| | S(402,405) LENGTH1,L2 | XXX,0,2,0 | A2,8,6,8 | B2,16,10,16 | C2,12,10,12 |
| | S(403,407,410) | XXX,0,0 | XXX,XXX,2 | A2,DEC1(8,2),16 | B2,DEC1(12,16),42 |
| | W1,M1,S(412) | XXX,0,0 | XXX,0,0 | XXX,0,DEC2(2) | ROT(A2,2), DEC1(8,2), DEC2(16) |

$DEC1(i,j) = ROT(\sum_{k=0}^{j} 2^{64-k}, j)$   LENGTH OF CODE WORD:

A1:2BIT, B1:6BIT, C1:10BIT, D1:10BIT, E1:8BIT, F1:10BIT, G1:16BIT, H1:8BIT
A2:8BIT, B2:16BIT, C2:12BIT, D2:2BIT, E2:14BIT, F2:12BIT, G2:16BIT, H2:6BIT $DEC2(i) = 2^{64-i}$

ROT(A,j) = ROTATE RIGHT A BY j

| 5A |
|---|
| 5B |

FIG. 5A
CONVENTIONAL ART

| SHIFTER | SIGNAL \ TIME | t=4 | t=5 | t=6 | t=7 |
|---|---|---|---|---|---|
| ⟨SHIFTER1⟩ | S(401,404) | E1,8 | F1,10 | G1,16 | H1,8 |
| | S(402,405) LENGTH1,L2 | D1,10,10,2 | E1,8,8,14 | F1,10,10,12 | G1,16,16,6 |
| | S(403,407,410) | C1,DEC1(10,32),54 | D1,DEC1(10,54),2 | E1,DEC1(8,2),24 | F1,DEC1(10,24),46 |
| | W1,M1,S(412) | ROT(B1,10), DEC1(6,10), DEC2(32) | ROT(C1,32), DEC1(10,32), DEC2(54) | ROT(D1,54), DEC1(10,54), DEC2(2) | ROT(E1,2), DEC1(8,2), DEC2(24) |
| ⟨SHIFTER2⟩ | S(401,404) | E2,14 | F2,12 | G2,16 | H2,6 |
| | S(402,405) LENGTH1,L2 | D2,2,8,2 | E2,14,10,14 | F2,12,16,12 | G2,16,8,16 |
| | S(403,407,410) | C2,DEC1(12,42), 64(=0) | D2,DEC1(2,0),10 | E2,DEC1(14,10),34 | F2,DEC1(12,34),62 |
| | W1,M1,S(412) | ROT(B2,16), DEC1(12,16), DEC2(42) | ROT(C2,42), DEC1(12,42), DEC2(0) | ROT(D2,0), DEC1(2,0), DEC2(10) | ROT(E2,10), DEC1(14,10), DEC2(34) |

$DEC1(i,j) = ROT(\sum_{k=0}^{j} 2^{64-k}, j)$  LENGTH OF CODE WORD:

A1:2BIT, B1:6BIT, C1:10BIT, D1:10BIT, E1:8BIT, F1:10BIT, G1:16BIT, H1:8BIT
A2:8BIT, B2:16BIT, C2:12BIT, D2:2BIT, E2:14BIT, F2:12BIT, G2:16BIT, H2:6BIT $DEC2(i) = 2^{64-i}$

ROT(A,j) = ROTATE RIGHT A BY j

| 5A |
|---|
| 5B |

| INPUT | WORD-LENGTH | CODEWORD |
|-------|-------------|----------|
| a | 2 | 00 |
| b | 2 | 01 |
| c | 3 | 100 |
| d | 3 | 101 |
| e | 3 | 110 |
| f | 4 | 1110 |
| g | 5 | 11110 |
| h | 5 | 11111 |

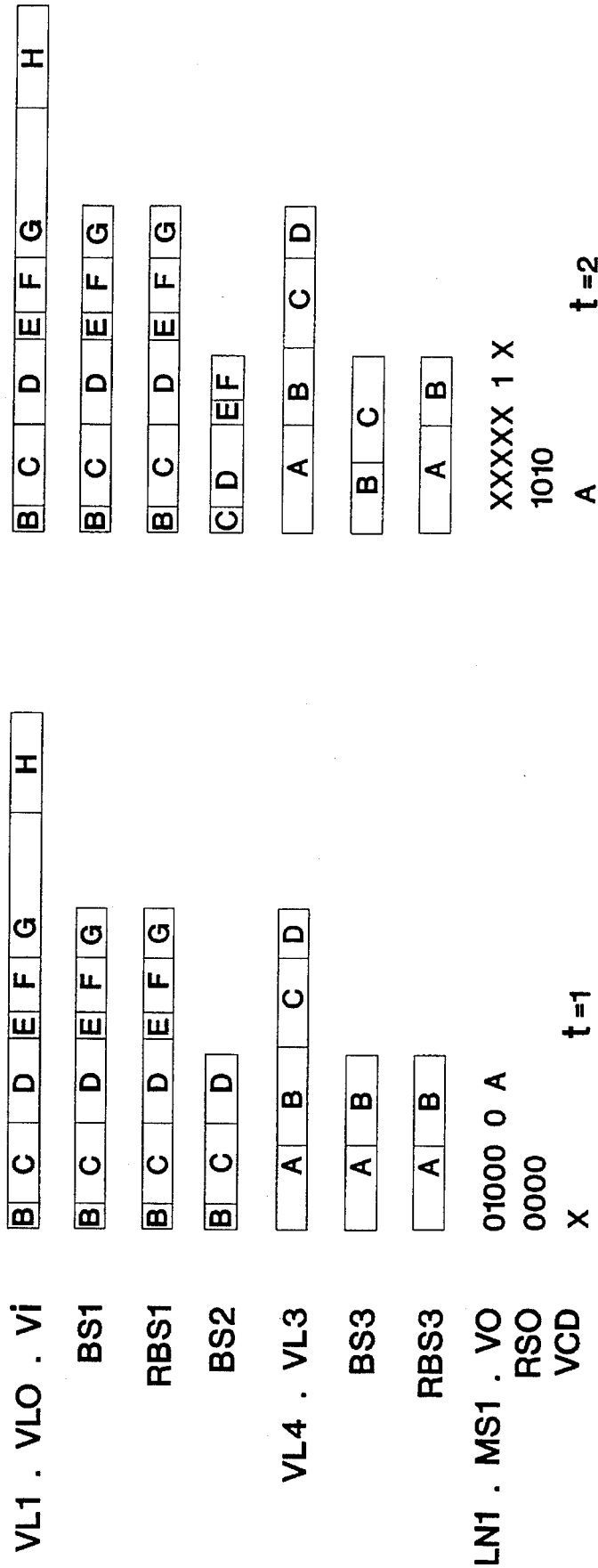

FIG. 10C

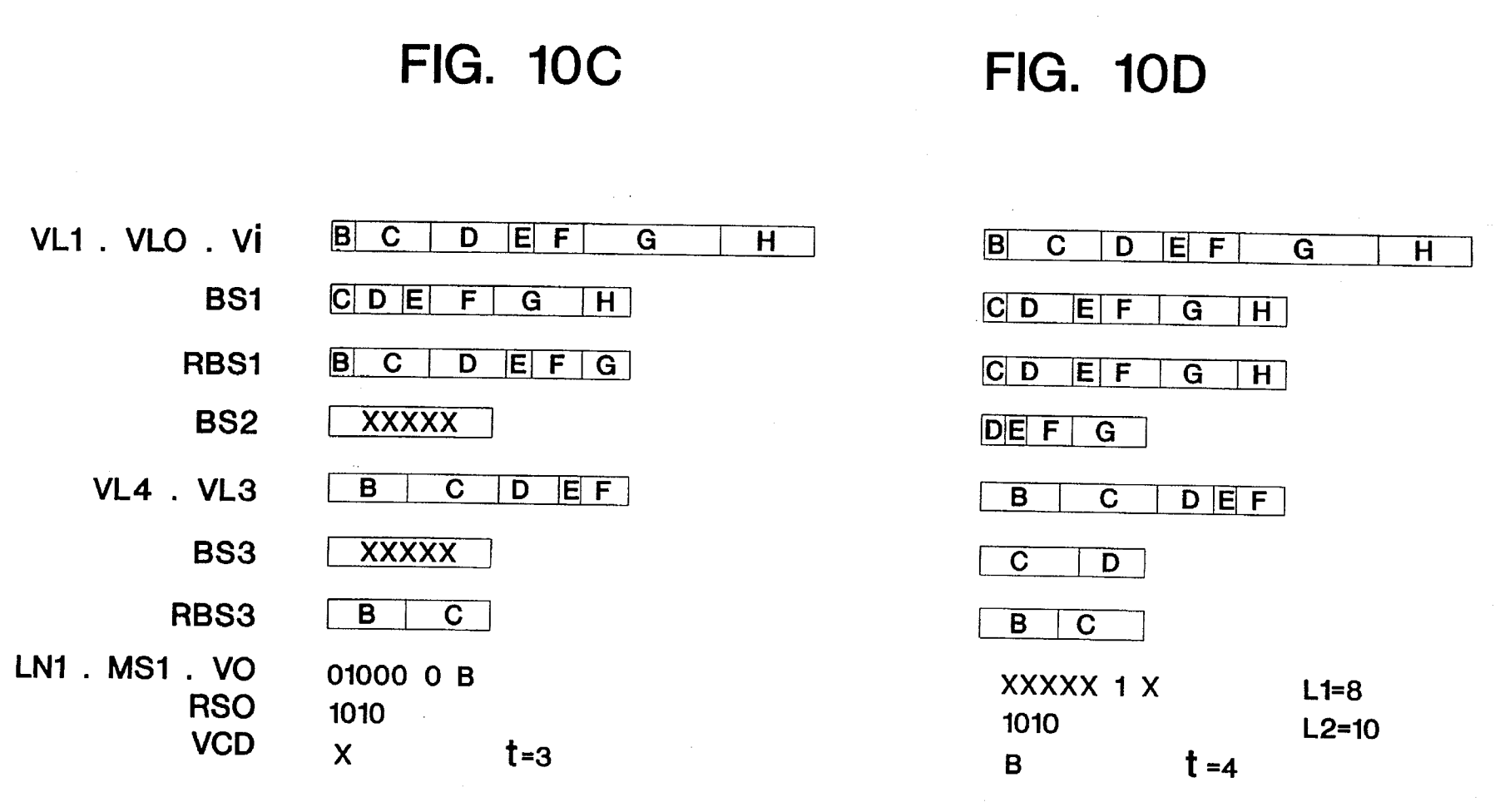

| | | | | | |
|---|---|---|---|---|---|
| VL1 . VL0 . Vi | B | C | D | E | F | G | H |
| BS1 | C | D | E | F | G | H |
| RBS1 | B | C | D | E | F | G |
| BS2 | XXXXX |
| VL4 . VL3 | B | C | D | E | F |
| BS3 | XXXX |
| RBS3 | B | C |
| LN1 . MS1 . V0 | 01000  0  B |
| RS0 | 1010 |
| VCD | X | t=3

FIG. 10D

| | | | | | |
|---|---|---|---|---|---|
| VL1 . VL0 . Vi | B | C | D | E | F | G | H |
| BS1 | C | D | E | F | G | H |
| RBS1 | C | D | E | F | G | H |
| BS2 | DE | F | G |
| VL4 . VL3 | B | C | D | E | F |
| BS3 | C | D |
| RBS3 | B | C |
| LN1 . MS1 . V0 | XXXXX  1  X |
| RS0 | 1010 |
| VCD | B | t=4

L1=8
L2=10

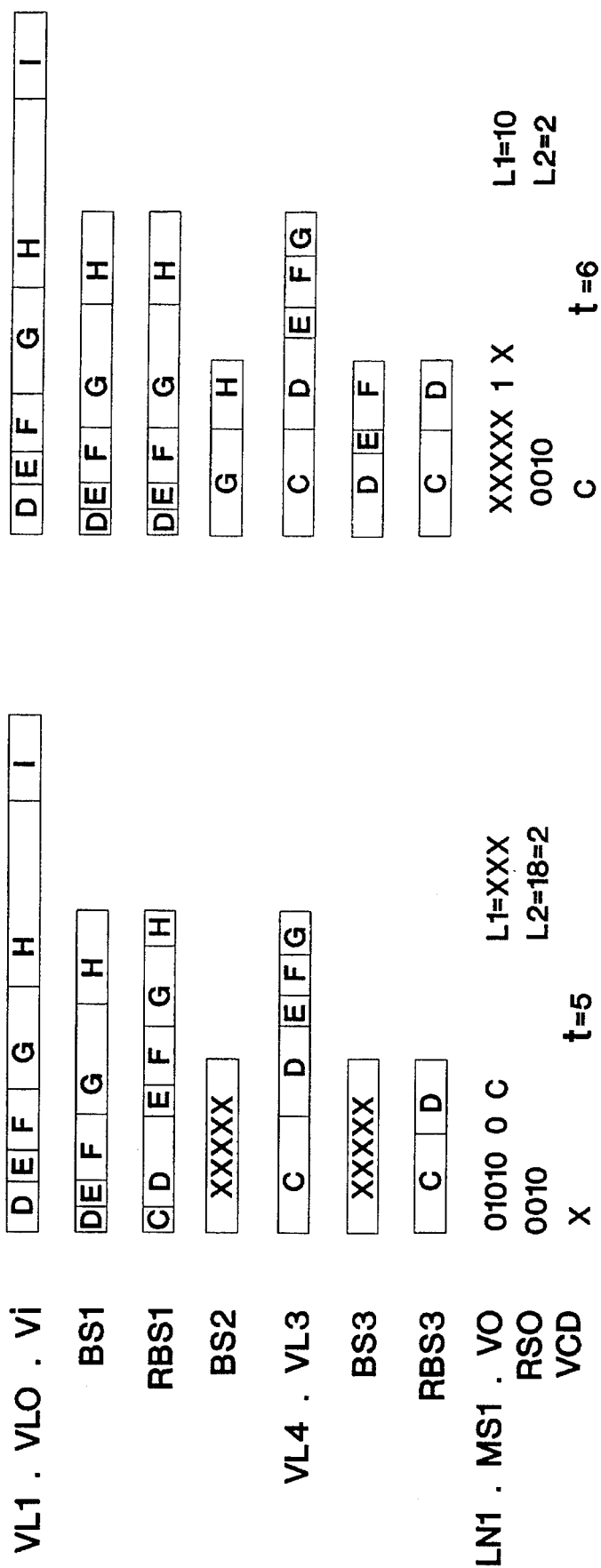

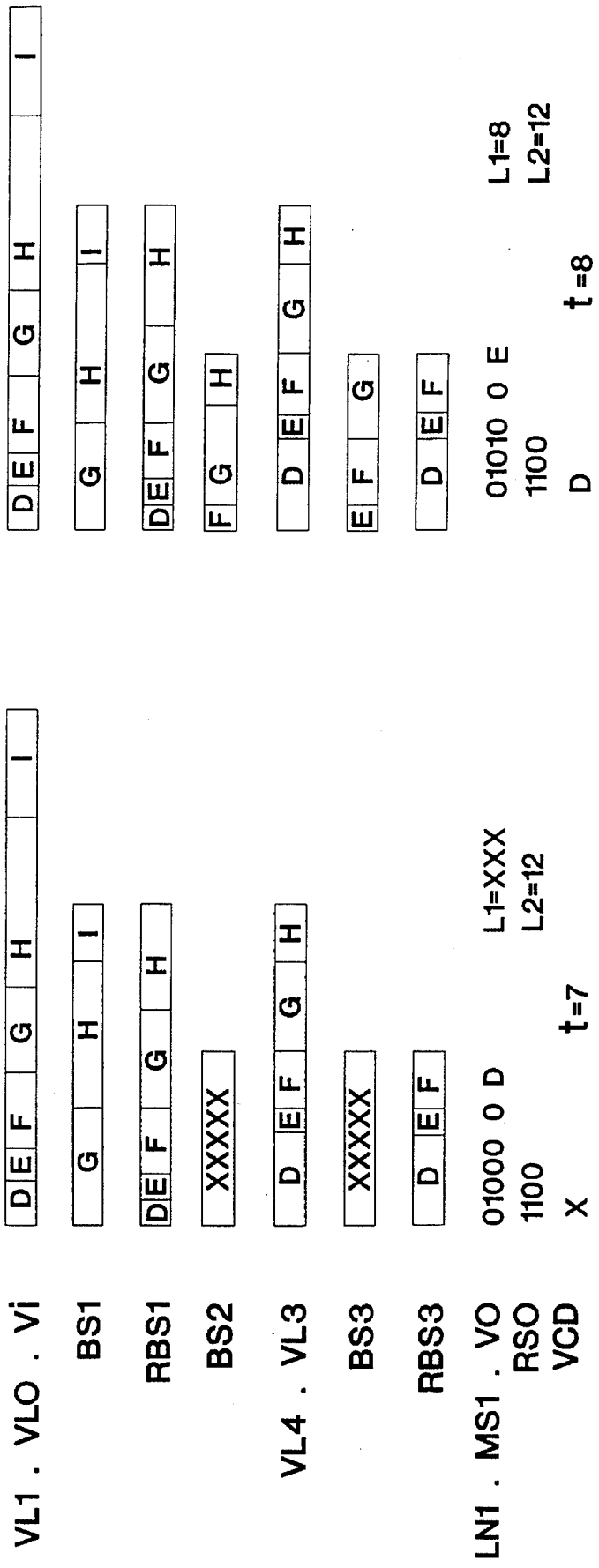

FIG. 10I

| | |
|---|---|
| VL1 . VLO . Vi | G H I J K L |
| BS1 | G H I J |
| RBS1 | G H I |
| BS2 | H |
| VL4 . VL3 | D E F G H |
| BS3 | F G |
| RBS3 | D E F |
| LN1 . MS1 . VO | 10000 0 F |
| RSO | 0100 |
| VCD | E | t=9  L1=10  L2=20

FIG. 10J

| | |
|---|---|
| | G H I J K L |
| | G H I |
| | G H I |
| | H I |
| | D E F G H |
| | G H |
| | D E F |
| | XXXXX 1 X |
| | 0110 |
| | F | t=10  L1=16  L2=6

FIG. 12A

VL1 . VL0  | D | E | F | G |
BS1 . RLN1 | A | B | C | D | E | 0000
LN1 . V0   00110 A t=1

FIG. 12B

| D | E | F | G |
| A | B | C | D | E | 0110
01010 B t=2

FIG. 12C

| D | E | F | G |
| A | B | C | D | E | 1010
01110 C t=3

FIG. 12D

VL1 . VL0  | D | E | F | G |
BS1 . RLN1 | A | B | C | D | E | 0110
LN1 . V0   11110 D t=4

FIG. 12E

| E | F | G | H | I |
| D | E | F | G | 0110
10110 E t=5

FIG. 12F

| G | H | I | J | K |
| E | F | G | H | I | 00110
01100 F t=6

A:6BIT, B:4BIT, C:4BIT, D:16BIT, E:8BIT, F:6BIT, G:12BIT, H:4BIT, I:8BIT, J:4BIT, K:10BIT

VARIABLE LENGTH CODER AND VARIABLE LENGTH DECODER

BACKGROUND OF THE INVENTION

1. Field of the Invention

The present invention relates in general to variable length coders and variable length decoders, and more particularly to a variable length coder for performing entropy coding for video data processed through spatial transformation and motion coding in real-time, and a variable length decoder for performing variable length decoding for the entropy-coded video data from the variable length coder in real-time.

2. Description of the Prior Art

Generally, entropy coding is used for compressing digital video data with no loss. In such an entropy coding technology, variable length coding is adopted in the case where a data generation probability is not fixed. Namely, the variable length coding is used to represent data of the higher generation probability as a shorter code while data of the lower generation probability as a longer code. A Huffman code is well-known as the most effective entropy code.

In the entropy coding technology, source coding is first performed for the digital video data to remove a data redundancy present in a signal source. The digital video data is then entropy-coded by run length coding and the variable length coding.

Then, the source-coded and entropy-coded data is decoded by a variable length decoder.

Referring to FIG. 1, there is shown a block diagram of a conventional variable length coder. As shown in this drawing, the conventional variable length coder comprises a register 7 for storing temporarily data VLi inputted therein, a code generator 10 for generating a codeword VCW and a codelength VCL corresponding to output data from the register 7 and outputting the generated codeword VCW and codelength VCL to registers 8 and 9, respectively, and barrel shifters 5 and 6 for shifting an output codeword from the register 8 and an output codeword from a register 4.

The register 4 is adapted to store temporarily an output codeword from the barrel shifter 6 and output the temporarily stored codeword to the barrel shifters 5 and 6.

Also, the conventional variable length coder comprises a register 3 for storing temporarily an output codeword from the barrel shifter 5 and outputting variable length-coded data VLCo, and a bit operation unit 1 for performing a logical operation for a reset signal RST and output data from a barrel shifter 2 to output an available data signal AVLC and apply bit information VL1 to the barrel shifters 2 and 5.

The barrel shifter 2 is adapted to accumulate an output codelength from the register 9.

The bit operation unit 1 includes a latch 14, flags 15–18, an OR gate OR1, a NOR gate NOR1 and an AND gate AN1. The code generator 10 is comprised of an uncoded-word table 11 of an AND-plane and a codeword table 12 and a codelength table 13 of OR-planes. The uncoded-word table 11, the codeword table 12 and the codelength table 13 are programmed logic arrays (PLAs), respectively.

Referring to FIG. 6, there is shown a block diagram of a conventional variable length decoder. As shown in this drawing, the conventional variable length decoder comprises an interface circuit 609 for arranging and shifting data Vi compressed into a variable length code, inputted therein to designate a codeword to be decoded, and a decoding circuit 610 for comparing the designated codeword from the interface circuit 609 with codeword information stored therein, applying length information of the designated codeword from the interface circuit 609 to the interface circuit 609 in accordance with the compared result and outputting a decoded word V0–V3 corresponding to the designated codeword from the interface circuit 609 in accordance with the compared result.

The interface circuit 609 includes a latch circuit 601 for inputting the data Vi through a buffer B1 and latching the inputted data Vi, a barrel shifter 602 for forming a 16-bit window I0–I15 according to output data VL0 and VL1 from the latch circuit 601, and an adder 606 for adding output data VL2 from a latch circuit 607 and a wordlength L0–L3 from the decoding circuit 610 and outputting the resultant data S0 and C0 to the latch circuit 607.

The latch circuit 607 is adapted to latch the output data S0 from the adder 606 to output shift bit information to the barrel shifter 602 and to latch a carry output C0 from the adder 606.

Also, the interface circuit 609 includes a read signal generator 608 for ANDing a clock signal CLK and a carry VL3 from the latch circuit 607 to generate a read signal RD and outputting the generated read signal RD to the buffer B1 and the latch circuit 601.

The decoding circuit 610 includes a codeword storage unit 603 for storing information regarding an output codeword from the barrel shifter 602, a wordlength storage unit 604 for outputting the wordlength L0–L3 according to output data Cw from the codeword storage unit 603, and a decoded word storage unit 605 for outputting the decoded word V0–V3 through a latch L4 according to the output data Cw from the codeword storage unit 603.

The codeword storage unit 603 is a PLA of an AND-plane, and the wordlength storage unit 604 and the decoded word storage unit 605 are PLAs of OR-planes.

The operation of the conventional variable length coder with the above-mentioned construction will hereinafter be described with reference to FIG. 1.

In response to the clock signal CLK and an enable signal EN, the register 7 stores temporarily the inputted data VLi and then outputs it to the code generator 10. The codeword VCW and the codelength VCL corresponding to the output data from the register 7 are determined by the uncoded-word table 11, the codeword table 12 and the codelength table 13 in the code generator 10 and then applied to the registers 8 and 9, respectively.

The codeword temporarily stored in the register 8 is applied to the barrel shifters 5 and 6 in response to the clock signal CLK and the enable signal EN. Each of the barrel shifters 5 and 6 employs a 16-bit sliding window for a 31-bit input. Upon receiving the current codelength from the register 9, the barrel shifter 6 shifts the codeword from the register 8 by the received codelength from the register 9 and outputs the shifted codeword to the register 4. In this case, a rightmost bit of the register 4 becomes a last data bit, thereby causing the data stored in the register 4 to be connected with the subsequently inputted data.

The barrel shifter 5 is controlled by a remaining bits number of the latch 14. The latch 14 functions to store the number of the bits remaining in the register 4. Namely, the remaining bits number of the latch 14 represents the number of the bits of the codeword present in the register 4. The remaining bits of the register 4 are arranged on the basis of the left side by the barrel shifter 5. If the sum of the remaining bits number and the bits number of the current codeword is greater than or equal to 16, 16-bit data to be first coded is applied from the barrel shifter 5 to the register 3.

On the other hand, the combination of the barrel shifter 2 and the latch 14 functions as an accumulator for accumulating a codelength. In the case where the number of the remaining bits in the register 4 is greater than or equal to 16, the right 16 bits of the output data from the barrel shifter 2 become all 0 and the flag 15 is set to 1 indicative of presence of available data. The output data from the latch 14 is applied to the barrel shifter 2 to allow the barrel shifter 2 to function as a rotator. The other 16-bit input to the barrel shifter 2 is connected to "0" for searching for a carry-out condition. Namely, if the right 16 bits of the output data from the barrel shifter 2 are all "0", the carry-out occurs. The left 16 bits of the output data from the barrel shifter 2 represent the number of newly remaining bits in the register 4.

Upon receiving the temporarily stored codelength from the register 9 in response to the clock signal CLK and the enable signal EN, the barrel shifter 6 shifts the inputted codeword by the received codelength and outputs the shifted codeword to the register 4. The barrel shifter 2 accumulates the codelength from the register 9 and outputs the accumulated value as shift information to the bit operation unit 1.

In the bit operation unit 1, the flags 18, 17 and 16 are set in response to the reset signal RST as the codeword is shifted in the above manner. The set flags 18, 17 and 16 are logically operated with the output data from the barrel shifter 2 by the OR gate OR1, the AND gate AN1 and the NOR gate NOR1, respectively. The output data from the OR gate OR1 and the AND gate AN1 are applied to the latch 14 and the output data from the NOR gate NOR1 is applied to the flag 15.

Then, upon receiving the bit information VL1 from the latch 14 as the available data signal AVLC, the flag 15 is set, and the barrel shifter 5 outputs 16-bit variable length-coded data to the register 3. Also in this case, the accumulated codelength value of the barrel shifter 2 is cleared.

As mentioned above, the conventional variable length coder has the three barrel shifters connected in parallel. The use of the three barrel shifters connected in parallel makes the time required in coding a single word constant. However, with the three barrel shifters connected in parallel, the conventional variable length coder has the disadvantage that an operation speed is low in the case where a plurality of words are coded in parallel.

Now, the operation of the conventional variable length decoder with the above-mentioned construction will be described with reference to FIG. 6.

First, the data stream Vi is inputted to the interface circuit 609. In the interface circuit 609, the buffer B1 applies the inputted data Vi to a latch L0 in the latch circuit 601 in the unit of 16 bits under the control of the read signal generator 608. In response to the next clock signal, the latch L0 shifts the existing data to a latch L1 of the latch circuit 601 and inputs the data Vi of new 16 bits. As a result, the latch circuit 601 outputs the latch data VL1 and VL0 of the respective 16 bits to the barrel shifter 602.

Upon receiving the output data VL1 and VL0 from the latches L1 and L0 in the latch circuit 601, the barrel shifter 602 forms the window of bits I0–I15, a leading bit of which is the first bit to be decoded among the received 32 bits. The window from the barrel shifter 602 is shifted by the output data VL2 from the latch circuit 607, resulting in the detection of the codeword. The detected codeword is then applied to the codeword storage unit 603. The codeword storage unit 603 detects the decoded data Cw corresponding to the received codeword and then outputs it to the wordlength storage unit 604 and the decoded word storage unit 605. The wordlength storage unit 604 outputs the wordlength L0–L3 corresponding to the decoded data Cw from the codeword storage unit 603 to the adder 606. The decoded word storage unit 605 outputs the decoded word V0–V3 corresponding to the decoded data Cw from the codeword storage unit 603 through the latch L4.

The adder 606 adds the output data L0–L3 from the wordlength storage unit 604 and the output data VL2 from the latch circuit 607 and outputs the added result as the bit shift information to a latch L2 in the latch circuit 607. The barrel shifter 602 forms the 16-bit window I0–I15 by shifting the output data VL1 and VL0 from the latch circuit 601 by the output data VL2 from the latch L2 in the latch circuit 607.

On the other hand, if the wordlength value accumulated by the adder 606 exceeds 16 in decoding, a latch L3 of the latch circuit 607 outputs the carry VL3 to the read signal generator 608. In the read signal generator 608, an AND gate AN11 ANDs the clock signal CLK and the carry VL3 from the latch circuit 607 and outputs the ANDed result as the read signal RD to the buffer B1 and the latch L0 of the latch circuit 601. As a result, the buffer B1 outputs the data Vi of new 16 bits to the latch L0 of the latch circuit 601.

The operation of the conventional variable length decoder will hereinafter be described in more detail with reference to FIGS. 7 and 8. FIG. 7 is a view illustrating an example of the wordlengths and codewords of the data used in the conventional variable length decoder of FIG. 6, and FIG. 8 is a view illustrating an example of the decoding operation of the conventional variable length decoder of FIG. 6.

In the case where the data as shown in FIG. 8 are latched by the latches L1 and L0, the first 2 bits of the window of the barrel shifter 602 are recognized as a symbol b and applied to the codeword storage unit 603 in response to the first clock signal. Then, upon receiving the wordlength "2" from the wordlength storage unit 604, the adder 606 adds the received wordlength "2" to an initial value "0" and outputs the resultant value "2" to the latch L2. The output data "2" from the latch L2 causes the window of the barrel shifter 602 to be shifted by "2" to the right. On the other hand, the decoded word storage unit 605 outputs the decoded word V0–V3 corresponding to the codeword matched in the codeword storage unit 603.

In response to the second clock signal, the subsequent 5 bits of the window of the barrel shifter 602 are recognized as a symbol g and applied to the codeword storage unit 603. Then, upon receiving the wordlength "5" from the wordlength storage unit 604, the adder 606 adds the received wordlength "5" to the previous value "2" and outputs the resultant value "7" to the latch L2. The output value "7" from the latch L2 causes the window of the barrel shifter 602 to be shifted by "7" to the right.

If the wordlength value accumulated by the adder 606 exceeds 16 in operation, the carry VL3 is generated in the latch L3 of the latch circuit 607 and applied to the read signal generator 608. In the read signal generator 608, the AND gate AN11 ANDs the clock signal CLK and the carry VL3 from the latch circuit 607 and outputs the ANDed result as the read signal RD to the buffer B1 and the latch L0 of the latch circuit 601. As a result, the buffer B1 outputs the data Vi of new 16 bits to the latch L0 of the latch circuit 601. Then, the above operation is repeatedly performed on the basis of the data Vi of the new 16 bits.

It should be noted that, in the above-mentioned conventional variable length decoder, the time required in the decoding is one cycle regardless of the length of the codeword, which is the sum of the delay time of the latch L0, the shifting delay time of the barrel shifter 602, the matching delay time of the codeword and the addition time of the adder 606. For this reason, the conventional variable length decoder has the disadvantage that the decoding time is fixed regardless of the length of the codeword. Also, although the data is transmitted at a high bit rate, the operation of accumulating the length of the matched codeword may be delayed. This causes the decoding not to be performed in real-time.

SUMMARY OF THE INVENTION

Therefore, the present invention has been made in view of the above problems, and it is an object of the present invention to provide a variable length coder for coding a plurality of words inputted at a time thereto at a high speed though a parallel process, and a variable length decoder for gaining simultaneous access to bits of the number to be shifted, when data is inputted to a code table, to perform a matching operation for bits other than designated bits, so as to remove shifting delay, and storing accumulated wordlength information to remove calculation delay in the matching operation, so that a decoding operation can be performed at a high speed in real-time.

In accordance with one aspect of the present invention, there is provided a variable length coder comprising a plurality of shifting means, each of said plurality of shifting means inputting a corresponding one of a plurality of codewords and a plurality of codelengths, rotating the corresponding codeword by a desired length for interconnection of the codewords and outputting masking bits designating a position of the corresponding codeword to be rotated; first ORing means for ORing output codewords from said plurality of shifting means; second ORing means for ORing output masking bits from said plurality of shifting means; word/mask register means for latching output codeword bits from said first ORing means when corresponding output masking bits from said second ORing means are enabled to "1"; and memory means for storing an output of said word/mask register means and outputting variable length-coded data.

In accordance with another aspect of the present invention, there is provided a variable length decoder comprising data shifting means for shifting input data in response to a previous codelength and a matching signal; decoding means for inputting output data from said data shifting means and the previous codelength, discriminating a matched state of the inputted data on the basis of the previous codelength, generating a current codelength, the matching signal and a decoded word in accordance with the discriminated result and outputting the generated matching signal to said data shifting means; and shift control means for controlling a shifting amount of said data shifting means in response to the current codelength and the matching signal from said decoding means and outputting the previous codelength to said data shifting means and said decoding means.

In accordance with yet another aspect of the present invention, there is provided a variable length decoder comprising data shifting means for shifting input data in response to a ready signal; and decoding means for detecting a current codelength from output data from said data shifting means on the basis of a previous codelength, outputting a most significant bit of the detected current codelength as the ready signal to said data shifting means and decoding the output data from said data shifting means on the basis of the previous codelength to output a decoded word.

BRIEF DESCRIPTION OF THE DRAWINGS

The above and other objects, features and advantages of the present invention will be more clearly understood from the following detailed description taken in conjunction with the accompanying drawings, in which:

FIG. 5 is a view illustrating a variation of data of each element in the shifter in FIG. 2 every clock signal;

FIG. 7 is a view illustrating an example of wordlengths and codewords of data used in the conventional variable length decoder of FIG. 6;

FIGS. 10A through 10J are views illustrating a variation of data of each element in FIG. 9 every clock signal;

FIGS. 12A through 12F are views illustrating a variation of data of each element in FIG. 11 every clock signal.

DETAILED DESCRIPTION OF THE PREFERRED EMBODIMENTS

Figure 1:
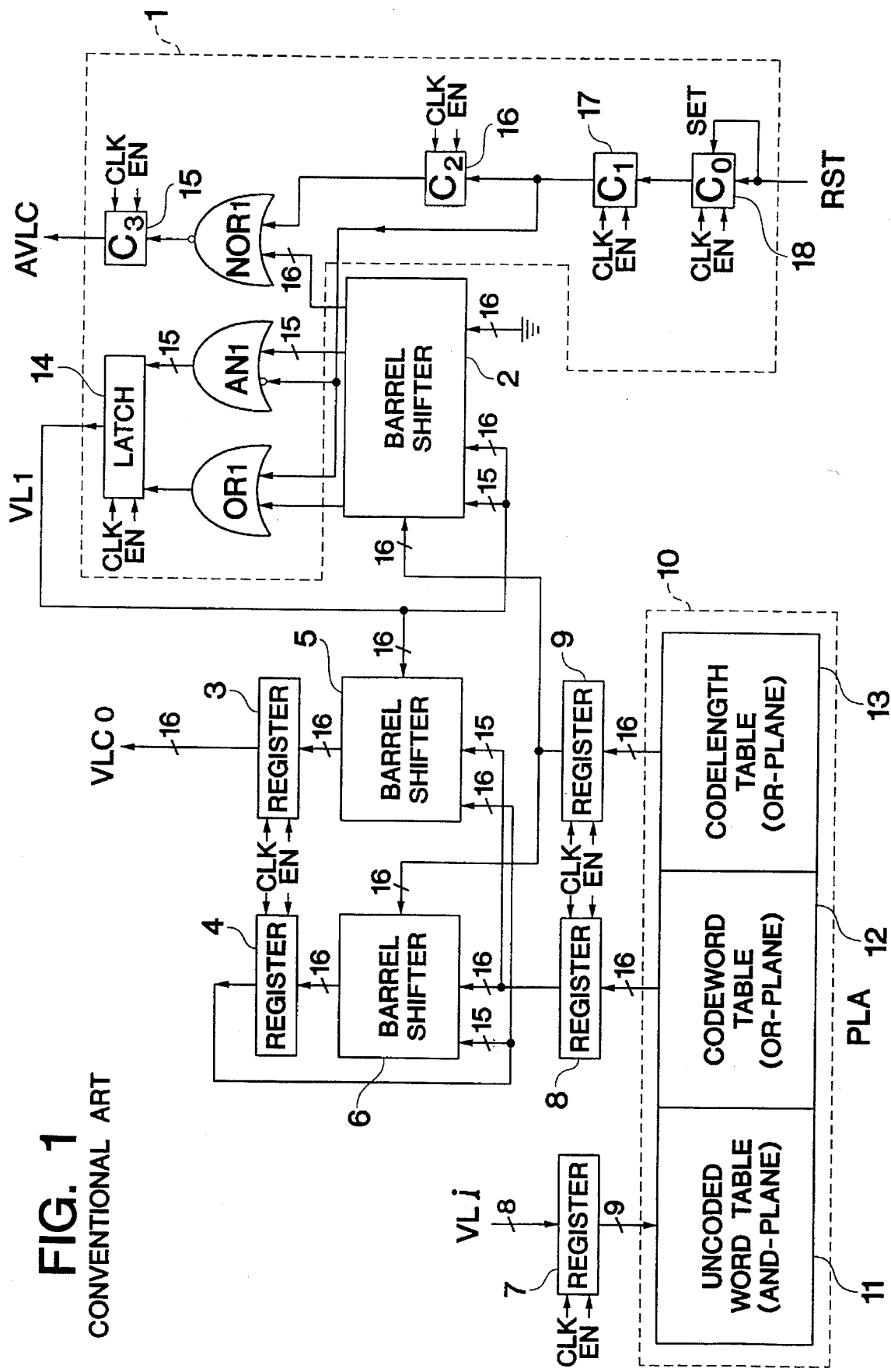
FIG. 1 is a block diagram of a conventional variable length coder.
Figure 2:
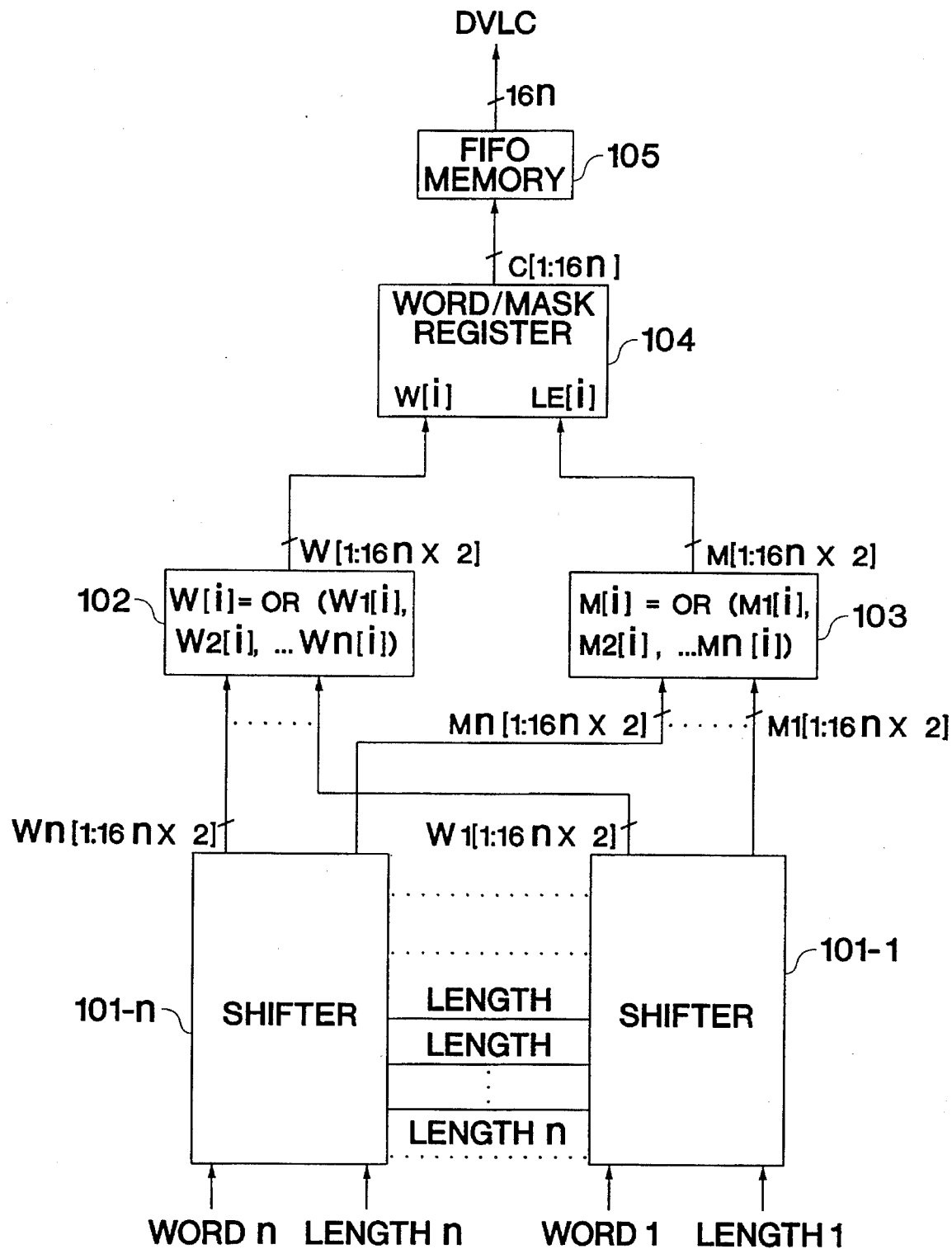
FIG. 2 is a block diagram of a variable length coder of the present invention.

Referring to FIG. 2, there is shown a block diagram of a variable length coder of the present invention. As shown in this drawing, the variable length coder of the present invention comprises n shifters 101-1 to 101-n, each of which inputs a corresponding one of n codewords word1-wordn and n codelengths length1-lengthn, shifts the corresponding codeword by a desired length for interconnection of the codewords, and outputs masking bits designating a position of the corresponding codeword to be shifted.

Also, the variable length coder of the present invention comprises an OR gate 102 for ORing output codewords W1[1:16nx2]-Wn[1:16nx2] from the n shifters 101-1 to 101-n, an OR gate 103 for ORing output masking bits M1[1:16nx2]-Mn[1:16nx2] from the n shifters 101-1 to 101-n, a word/mask register 104 for latching output codeword bits W[1:16nx2] from the OR gate 102 when corresponding output masking bits M[1:16nx2] from the OR gate 103 are enabled to "1", and a first-in-first-out (FIFO) memory 105 for storing an output C[1:16n] of the word/mask register 104 and outputting variable length-coded data DVLC.

Here, although it is assumed that each of the codewords inputted to the shifters 101-1 to 101-n has the maximum length of 16 bits, various modifications are possible. For example, each of the codewords inputted to the shifters 101-1 to 101-n may have the maximum length greater than 16 bits. In this case, the shifters may process the inputted codewords in the unit of 16 bits. Also, the number of the used shifters is n for performing the variable length coding at the high speed. For example, in the case where the number of the used shifters is 2, a codeword Wi[1:16n×2] means that a codeword outputted from the ith shifter 101-i has a length of a range of 1 to 64 bits.

Figure 3:
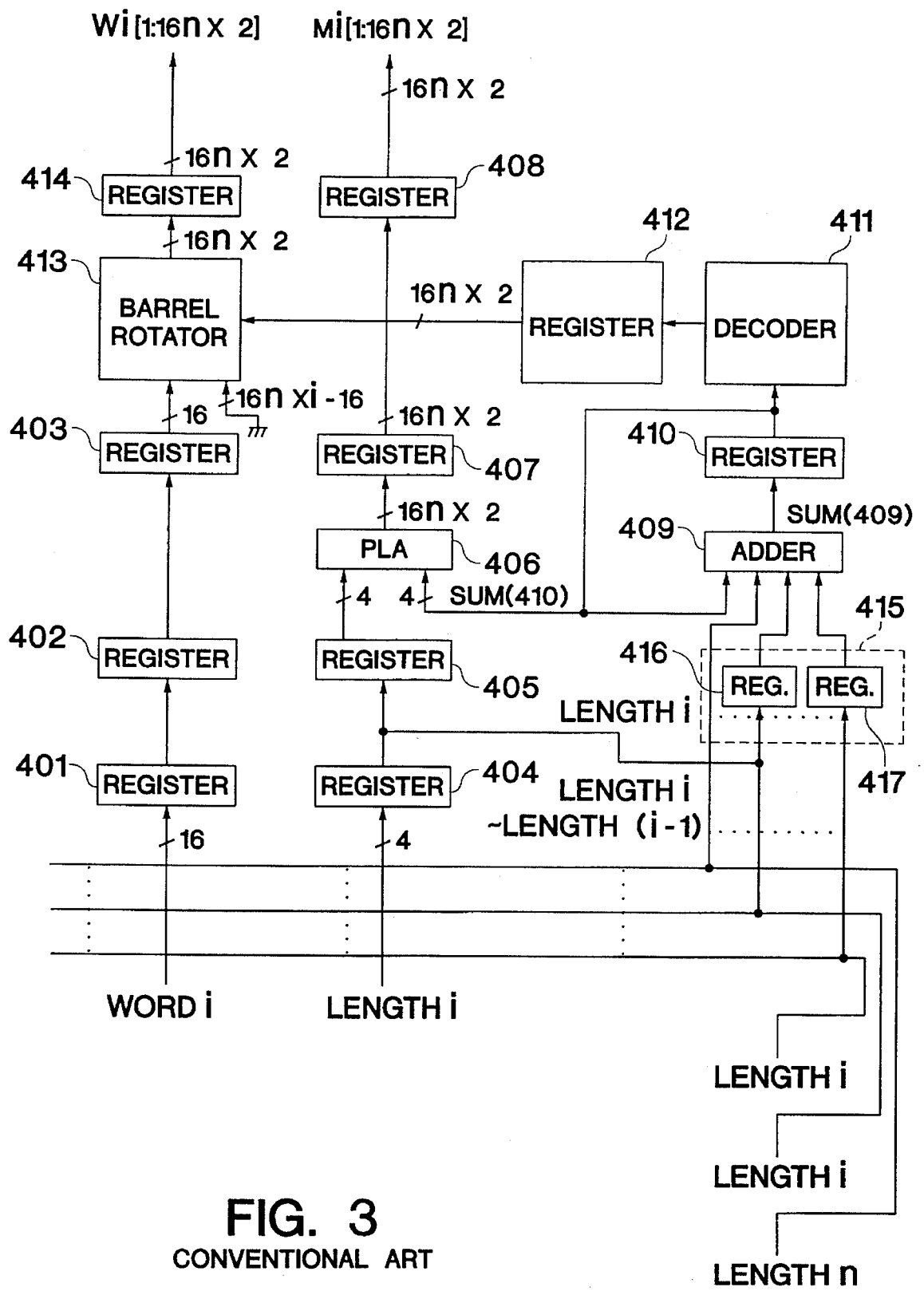
FIG. 3 is a detailed block diagram of a shifter in FIG. 2.

Referring to FIG. 3, there is shown a detailed block diagram of the ith shifter 101-i. As shown in this drawing, the ith shifter 101-i includes registers 401–403 for storing sequentially the ith codeword wordi, registers 404 and 405 for storing sequentially the ith codelength lengthi, an interface circuit 415 for inputting an output codelength from the register 404, and an adder 409 for adding output data from the interface circuit 415 and output data SUM(410) from a register 410.

The register 410 is adapted to store output data from the adder 409 and output the stored data to a PLA 406, the adder 409 and a decoder 411.

The PLA 406 is adapted to obtain the masking bits Mi[1:16n×2] by setting bits of the number corresponding to an output codelength from the register 405 to "1" and rotating the resultant bits by the output data SUM(410) from the register 410 and output the obtained masking bits Mi[1:16n×2] through registers 407 and 408.

The decoder 411 is adapted to decode the output data SUM(410) from the register 410 and output the decoded data to a barrel rotator 413 through a register 412 to control a rotating size of the barrel rotator 413.

The barrel rotator 413 is adapted to rotate an output codeword from the register 403 according to output data from the register 412 and output the rotated codeword Wi[1:16n×2] through a register 414.

The interface circuit 415 is adapted to apply 1st to (i-1)th codelengths directly to the adder 409, whereas ith to nth codelengths through its registers to the adder 409. The barrel rotator 413 may be substituted with two barrel shifters.

Figure 4:
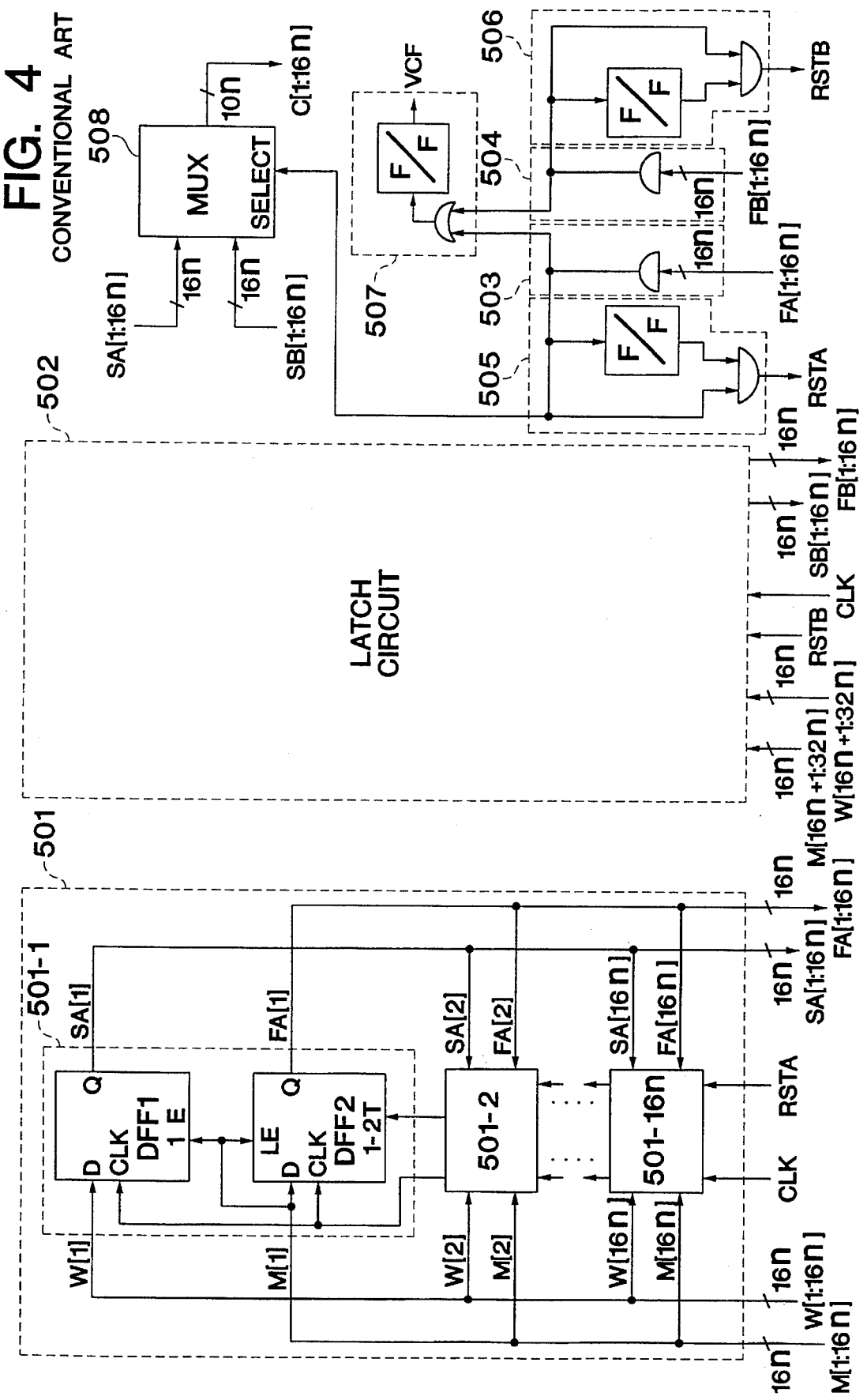
FIG. 4 is a detailed block diagram of a word/mask register in FIG. 2.
Figure 6:
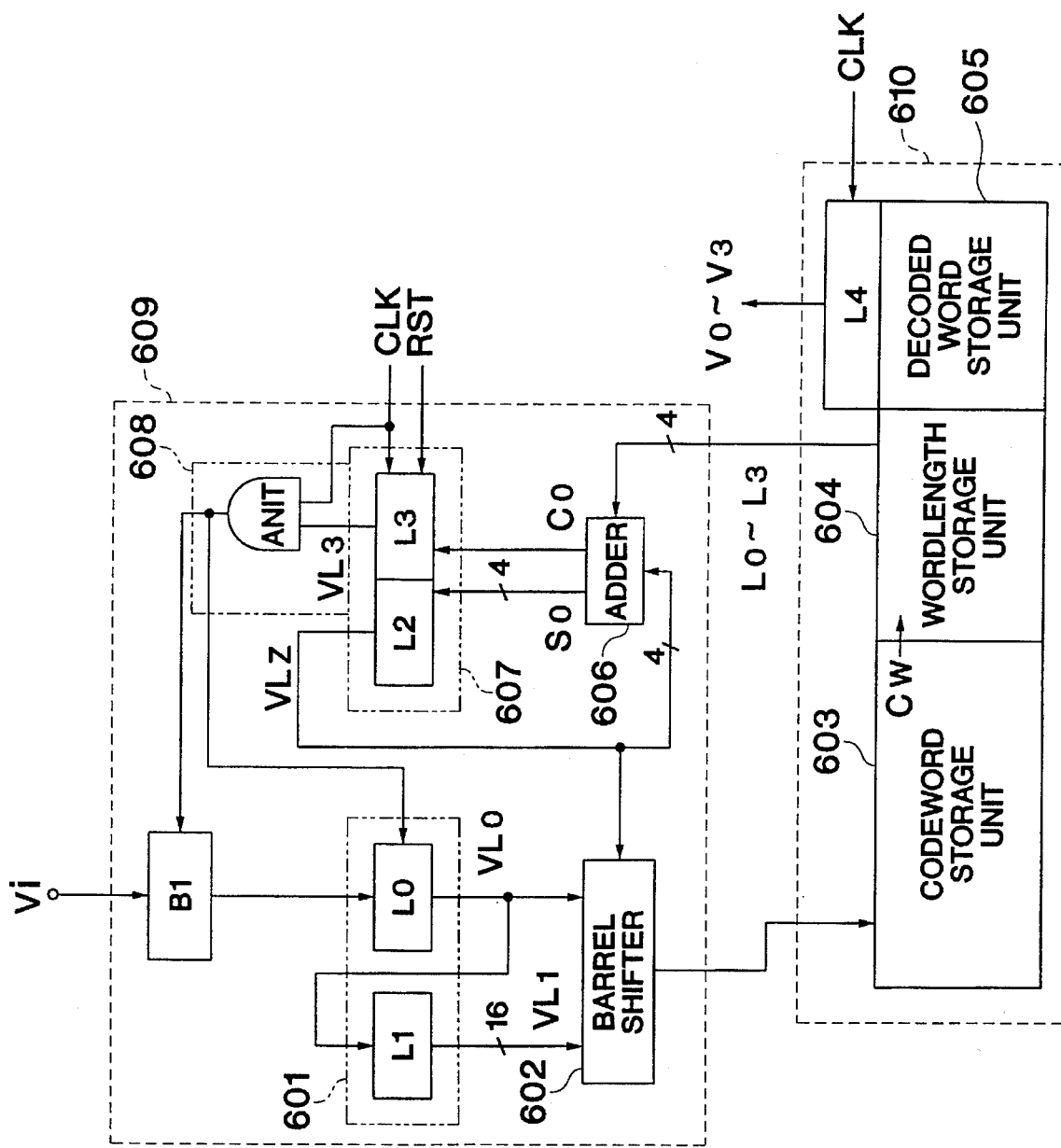
FIG. 6 is a block diagram of a conventional variable length decoder.
Figure 8:
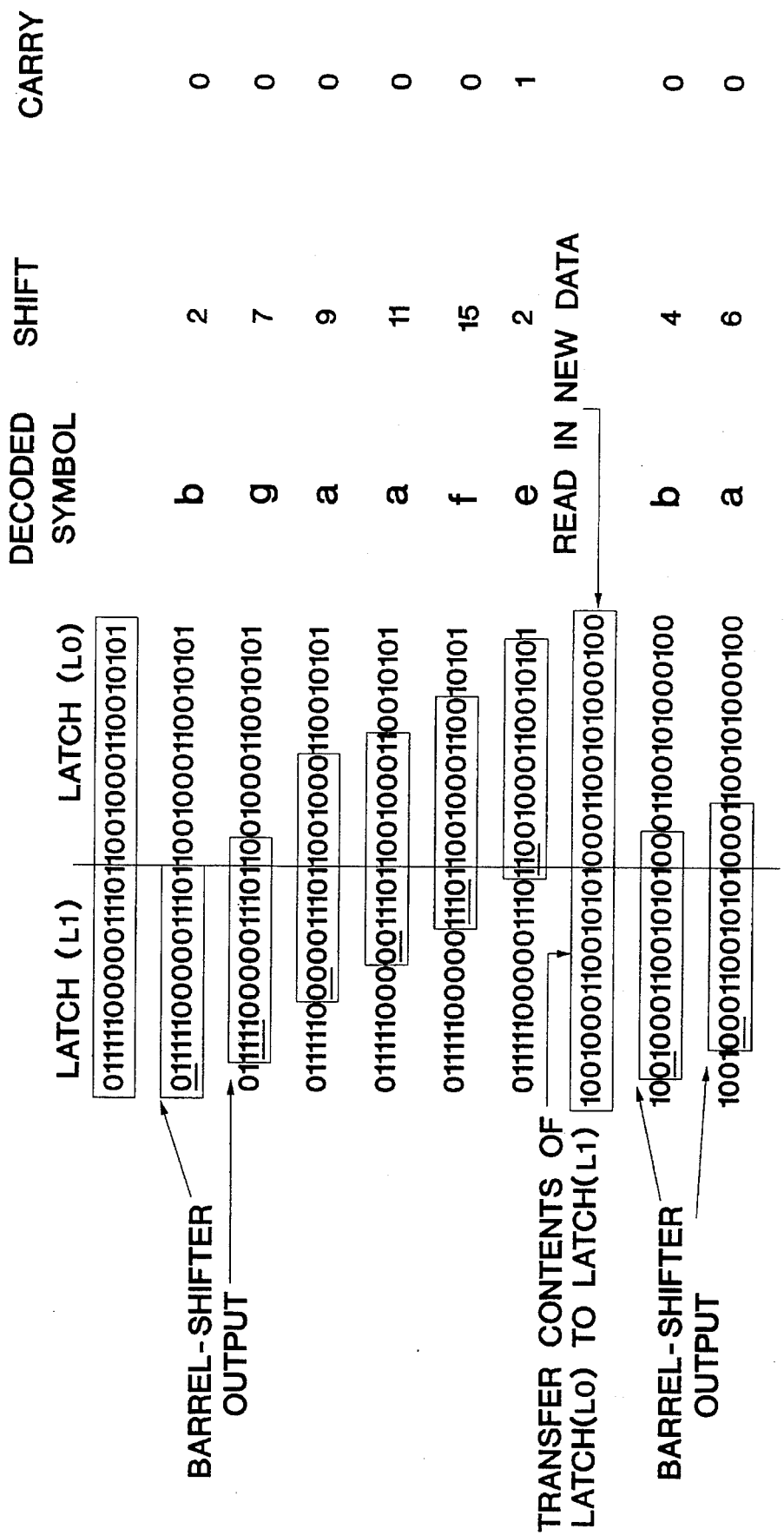
FIG. 8 is a view illustrating an example of a decoding operation of the conventional variable length decoder of FIG. 6.

Referring to FIG. 4, there is shown a detailed block diagram of the word/mask register 104 in FIG. 2. As shown in this drawing, the word/mask register 104 includes a latch circuit 501 being enabled in response to the masking bits M[1:16n] from the OR gate 103 to latch the masking bits M[1:16n] and the codeword bits W[1:16n] from the OR gate 102 synchronously with a clock signal CLK if i<16n, and a latch circuit 502 being enabled in response to the masking bits M[16n+1:32n] from the OR gate 103 to latch the masking bits M[16n+1:32n] and the codeword bits W[16n+1:32n] from the OR gate 102 synchronously with the clock signal CLK if i>16n.

Also, the word/mask register 104 includes a bit set state discriminator 503 for ANDing first output data bits FA[1:16n] from the latch circuit 501 and discriminating a masking bit set state in accordance with the ANDed result, a bit set state discriminator 504 for ANDing first output data bits FB[1:16n] from the latch circuit 502 and discriminating a masking bit set state in accordance with the ANDed result, a reset signal generator 505 for inputting output data from the bit set state discriminator 503 directly and through a flip-flop and ANDing the inputted data to output a reset signal RSTA to the latch circuit 501, a reset signal generator 506 for inputting output data from the bit set state discriminator 504 directly and through a flip-flop and ANDing the inputted data to output a reset signal RSTB to the latch circuit 502, a flag generator 507 for ORing the output data from the bit set state discriminators 503 and 504 and outputting the ORed result as an available code flag VCF through a flip-flop, and a multiplexer 508 for selectively outputting second output data bits SA[1:16n] and SB[1:16n] from the latch circuits 501 and 502 in response to the output data from the bit set state discriminator 503.

The latch circuit 501 includes a plurality of latches 501-1 to 501-16n, each of which latches a corresponding one of the codeword bits Wi (i=1 to 16n) from the OR gate 102 and a corresponding one of the masking bits Mi (i=1 to 16n) from the OR gate 103. Each of the latches 501-1 to 501-16n includes a flip-flop DFF1 for latching the corresponding one of the codeword bits Wi (i=1 to 16n) from the OR gate 102, and a flip-flop DFF2 for latching the corresponding one of the masking bits Mi (i=1 to 16n) from the OR gate 103. The latch circuit 502 has the same construction as that of the latch circuit 501.

Now, the operation of the variable length coder with the above-mentioned construction in accordance with the present invention will hereinafter be described in detail.

Upon the input of the data to be variable length-coded, the codewords word1-wordn and the codelengths length1-lengthn corresponding to the inputted data are applied to the shifters 101-1 to 101-n, respectively. The shifters 101-1 to 101-n calculates the positions of the corresponding codewords to be shifted, for the interconnection of the codewords with different lengths. The shifters 101-1 to 101-n then shift the corresponding codewords to the calculated positions.

The operation of the ith shifter 101-i among the n shifters 101-1 to 101-n connected in parallel will hereinafter be described in detail with reference to FIG. 3.

The ith codeword wordi is sequentially stored into the registers 401–403 and then applied to the barrel rotator 413. The ith codelength lengthi is applied to the register 405 and the interface circuit 415 through the register 404. The ith codelength lengthi is also applied to an interface circuit of a different shifter connected in parallel to the ith shifter 101-i.

The interface circuit 415 applies the 1st to (i-1)th codelengths directly to the adder 409, whereas ith to nth codelengths lengthi-lengthn through its registers 416 and 417 to the adder 409 for time delay. The adder 409 accumulates the 1st to nth codelengths and outputs the accumulated value SUM(409) to the PLA 406 and the decoder 411 through the register 410. The output SUM(409) of the adder 409 is also fed back thereto through the register 410. The output SUM(409) of the adder 409 can be expressed by the following equation (1):

$$\text{SUM}(409) = \text{SUM}(410) + \sum_{i=1}^{i-1} \text{length}i + \sum_{j=1}^{n} Lj \qquad (1)$$

In the above equation (1), lengthi is the codelength applied directly to the adder 409 and Lj is the codelength applied to the adder 409 through the registers 416 and 417.

The barrel rotator 413 combines the codeword wordi sequentially delayed by the registers 401–403 with 16n×2-16 "0"s. The input of 16n×2-16 "0"s is for making up a difference between the bits number "16" of the input data and the bits number "16n×2" of the output data. The decoder 411 decodes the accumulated codelength value inputted through the register 410 to set bits of the number corresponding to the decoded value to "1". Then, the decoder 411 applies the resultant bits to the barrel rotator 413 through the register 412. The data of the barrel rotator 413 is shifted by the output data from the register 412. The barrel rotator 413 shifts the codeword by a size designated by the output data from the register 412, in a similar manner to the barrel shifter. But, noticeably, the barrel rotator 413 rotates a data portion being removed due to the shifting, to the opposite input. Namely, the data shifted to the left is again used as the right input. The codeword Wi[1:16n×2] rotated in this manner is applied to the OR gate 102 through the register 414.

Here, the delay time of the codeword wordi through the registers 401–403 to the barrel rotator 413 is the same as that of the codelength lengthi through the adder 409 and the decoder 411 to the barrel rotator 413.

The PLA 406 sets bits of the number corresponding to the output codelength from the register 405 to "1" and rotates the resultant bits by the output data SUM(410) from the register 410, so as to determine a length and a relative position of the codeword. The output data from the PLA 406 is the masking bits Mi[1:16nx2], which are applied to the OR gate 103 through the registers 407 and 408. Bits set to "1" among the masking bits Mi[1:16nx2] represent the amount and position of an available code of the codeword Wi[1:16nx2] to be rotated.

The above operation is performed in the same manner by the n shifters 101-1 to 101-n with respect to the n codewords word1-wordn and the n codelengths length1-lengthn. If n=2, two shifters are connected in parallel to each other.

Then, the OR gates 102 and 103 OR the shifted codewords Wi[1:16nx2] and the masking bits Mi[1:16nx2] from the shifters 101-1 to 101-n, respectively. On the basis of the fact that only one bit is set to "1" in the case of $1 \leq I \leq 16nx2$ and i of a range of 1 to n for a random I, the OR gates 102 and 103 perform the following operations for the input data Mi[I] and Wi[I]:

$$M[I]=M1[I]|M2[I]|\ldots|Mn[I] \quad W[I]=W1[I]|W2[I]|\ldots|Wn[I] \quad (2)$$

where, $1 \leq I \leq 16nx2$ and $1 \leq i \leq n$

In the above equation (2), "|" means bit OR. The word/mask register 104 inputs only the output data bits W[1:16nx2] from the OR gate 102 corresponding to the case where the masking bits M[1:16nx2] or the output data bits from the OR gate 103 are enabled to "1". Also, the word/mask register 104 does not input the output data bits W[1:16nx2] from the OR gate 102 corresponding to the case where the masking bits M[1:16nx2] or the output data bits from the OR gate 103 are disabled to "0". In this case, the previous data being not changed is applied to the FIFO memory 105.

The operation of the word/mask register 104 will hereinafter be described in detail with reference to FIG. 4.

The codeword bits Wi (i=1 to 16n) and the masking bits Mi (i=1 to 16n) are applied to the latch circuit 501 and the codeword bits Wi (i=16n+1 to 32n) and the masking bits Mi (i=16n+1 to 32n) are applied to the latch circuit 502.

In the latch circuit 501, the codeword bits Wi (i=1 to 16n) and the masking bits Mi (i=1 to 16n) are applied to the latches 501-1 to 501-16n. In the latch 501-1, the flip-flops DFF1 and DFF2 are enabled if the masking bit M[1] is enabled to "1", thereby causing the codeword bit W[1] and the masking bit M[1] to be outputted therefrom synchronously with the clock signal CLK. On the contrary, if the masking bit M[1] is disabled to "0", the previous state is maintained as it is. This operation is performed in the same manner by the latches in the latch circuits 501 and 502.

The latch circuits 501 and 502 then outputs the codeword bits SA[1:16n] and SB[1:16n] and the masking bits FA[1:16n] and FB[1:16n], respectively. The masking bits FA[1:16n] and FB[1:16n] from the latch circuits 501 and 502 are applied to the bit set state discriminators 503 and 504, respectively.

In the bit set state discriminators 503 and 504, the masking bits FA[1:16n] and FB[1:16n] from the latch circuits 501 and 502 are ANDed by AND gates, respectively. If the output of the bit set state discriminator 503 is "1", the flag generator 507 outputs the available code flag VCF of "1" through its OR gate and flip-flop F/F. In response to the output of the bit set state discriminator 503, the multiplexer 508 selects the output data bits SA[1:16n] of the latch circuit 501 and then applies them to the FIFO memory 105. Also in the reset signal generator 505, an AND gate inputs the output data from the bit set state discriminator 503 directly and through the flip-flop and ANDs the inputted data. The ANDed result from the AND gate is applied as the reset signal RSTA to the latch circuit 501. Upon receiving the reset signal RSTA from the reset signal generator 505, the flip-flops in the latch circuit 501 are cleared, thereby causing the output of the bit set state discriminator 503 to be disabled to "0".

Similarly, if the output of the bit set state discriminator 504 is "1", the flag generator 507 outputs the available code flag VCF of "1" through its OR gate and flip-flop F/F. In response to the output of the bit set state discriminator 503 which is "0", the multiplexer 508 selects the output data bits SB[1:16n] of the latch circuit 502 and then applies them to the FIFO memory 105. Also in the reset signal generator 506, an AND gate inputs the output data from the bit set state discriminator 504 directly and through the flip-flop and ANDs the inputted data. The ANDed result from the AND gate is applied as the reset signal RSTB to the latch circuit 502. Upon receiving the reset signal RSTB from the reset signal generator 506, the flip-flops in the latch circuit 502 are cleared, thereby causing the output of the bit set state discriminator 504 to be disabled to "0".

Then, the FIFO memory 105 stores the output data C[1:16n] from the word/mask register 104 and outputs the variable length-coded data DVLC.

The above-mentioned operation of the variable length coder in accordance with the present invention will hereinafter be described in more detail with reference to a data flowchart of FIG. 5. More particularly, the operations of two shifters connected in parallel to each other will hereinafter be mentioned with respect to the cases of t=2 and t=3.

In the first shifter, at the moment t=3, if a codeword D1 and a codelength 10 are applied to the registers 401 and 404, respectively, data C1 and 10 of the registers 401 and 404 at the moment t=2 are stored into the registers 402 and 405, respectively. Applied into the adder 409 are codelengths 10 and 12 of data C1 and C2 at the moment t=2 through the registers of the interface circuit 415. Data B1 of the register 402 at the moment t=2 is applied to the register 403. Applied to the register 407 is decl(6,10) in which 6 is a value of the register 405 at the moment t=2 and 10 is a value of the register 410 at the moment t=2. Here, decl(i,j) is $$rot\left(\sum_{k=0}^{i} 2^{64-k} j\right),$$

which means that $$\sum_{k=0}^{i} 2^{64-k}$$

is rotated by j to the right. Namely, decl(6, 10) means that bits from the left up to the sixth bit are rotated by 10 and then applied to the register 407. The adder 409 adds values 6 and 16 inputted through the interface circuit 415 thereto at the moment t=2 to the value 10 of the register 410 and applies the added value 32 to the register 410. Wi is rot(A1,0), which means that a value A1 stored into the register 403 at the moment t=2 is rotated by a control value 0 of the register 412 to the right. Mi is obtained by taking decl(2,0) for a value of the register 407 at the moment t=2. A value of the register 412 is decl(10), in which 10 is a value of the register 410 at the moment t=2, which means that the tenth bit from the left is "1" and the other bits are all "0".

In the second shifter, at the moment t=3, if a codeword D2 and a codelength 2 are applied to the registers 401 and 404, respectively, the adder 409 inputs the codelength 10 of the first shifter directly and the codelength 12 of C2 at the moment t=2 through the interface circuit 415. The subsequent operation of the second shifter is the same as that of the first shifter and a description thereof will thus be omitted.

As apparent from the above description, according to the present invention, the variable length coder employs such a parallel process that the words inputted at a time are shifted to the desired positions by the barrel rotators and then simultaneously coded by latching only the bits corresponding to the set state of the flag indicating the code presence position. Therefore, the present invention may be applied to encoders of a digital television, a high definition television (HDTV) and a digital video cassette recorder (DVCR) to code video signals at a high speed.

Figure 9:
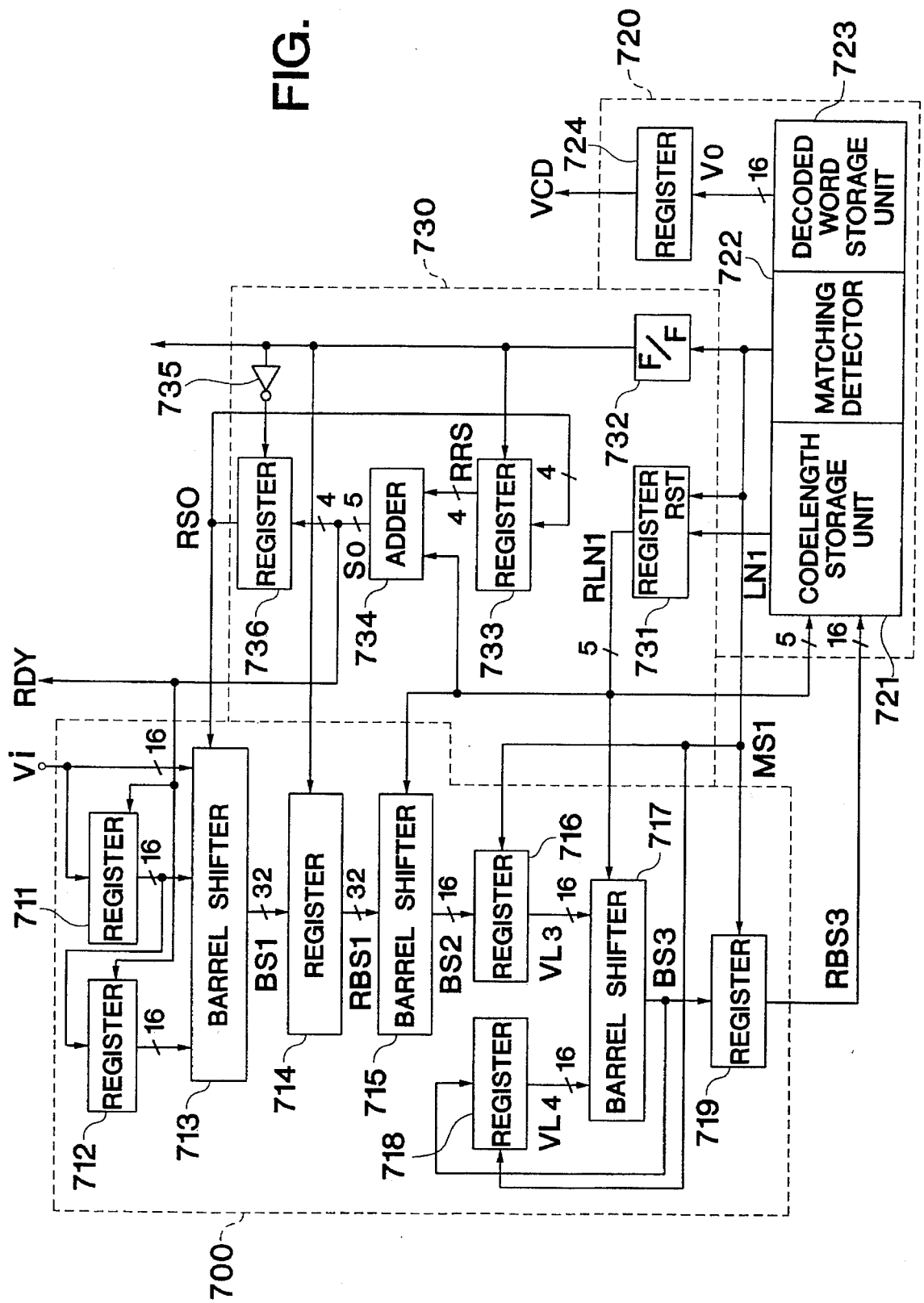
FIG. 9 is a block diagram of an embodiment of a variable length decoder in accordance with the present invention.

Referring to FIG. 9, there is shown a block diagram of an embodiment of a variable length decoder in accordance with the present invention. As shown in this drawing, the variable length decoder of the present invention comprises a data shifter 700 for shifting input data Vi according to outputs of a decoding circuit 720 and a shift controller 730.

The decoding circuit 720 is adapted to input output data RBS3 from the data shifter 700 and a previous codelength RLN1 from the shift controller 730, discriminate a matched state of the inputted data RBS3 on the basis of the previous codelength RLN1, generate a current codelength LN1, a matching signal MS1 and a decoded word VCD in accordance with the discriminated result and output the generated current codelength LN1 to the shift controller 730 and the generated matching signal MS1 to the shift controller 730 and the data shifter 700.

The shift controller 730 is adapted to control a shifting amount of the data shifter 700 in response to the current codelength LN1 and the matching signal MS1 from the decoding circuit 720 and output the previous codelength RLN1 to the data shifter 700 and the decoding circuit 720.

The data shifter 700 includes registers 711 and 712 for storing sequentially the input data Vi in response to a ready signal RDY from the shift controller 730, a barrel shifter 713 for shifting output data VL0 and VL1 from the registers 711 and 712 and the input data Vi by an accumulated codelength value RS0 from the shift controller 730, a register 714 for storing and outputting output data BS1 from the barrel shifter 713 in response to an available code signal VCF from the shift controller 730, a barrel shifter 715 for shifting output data RBS1 from the register 714 by the previous codelength RLN1 from the shift controller 730, a register 716 for storing and outputting output data BS2 from the barrel shifter 715 in response to the matching signal MS1 from the decoding circuit 720, a barrel shifter 717 for shifting output data VL3 from the register 716 and output data VL4 from a register 718 by the previous codelength RLN1 from the shift controller 730, and a register 719 for outputting output data BS3 from the barrel shifter 717 to the decoding circuit 720 in response to the matching signal MS1 from the decoding circuit 720. The register 718 is adapted to temporarily store the output data BS3 from the barrel shifter 717 and feed the stored data back to the barrel shifter 717 in response to the matching signal MS1 from the decoding circuit 720.

The shift controller 730 includes a register 731 for storing the current codelength LN1 from the decoding circuit 720 and outputting the stored codelength as the previous codelength RLN1 to the data shifter 700 and the decoding circuit 720, a flip-flop 732 for latching the matching signal MS1 from the decoding circuit 720 and outputting the latched signal as the available code signal VCF to the data shifter 700, an inverter 735 for inverting the available code signal VCF from the flip-flop 732, a register 733 for storing temporarily the accumulated codelength value RS0 in response to the available code signal VCF from the flip-flop 732, an adder 734 for adding the previous codelength RLN1 from the register 731 and output data RR5 from the register 733 and outputting the added value as the ready signal RDY and a sum signal S0, and a register 736 for storing the sum signal S0 from the adder 734 and outputting the stored signal as the accumulated codelength value RS0 to the data shifter 700 and the register 733 in response to an output signal from the inverter 735.

The decoding circuit 720 includes a codelength storage unit 721 for matching the output data RBS3 from the data shifter 700 with data stored therein on the basis of the previous codelength RLN1 from the shift controller 730 and outputting the current codelength LN1 to the shift controller 730 in accordance with the matched result, a matching detector 722 for generating the matching signal MS1 according to the matching operation of the codelength storage unit 721 and outputting the generated matching signal MS1 to the data shifter 700 and the shift controller 730, a decoded word storage unit 723 for outputting a desired decoded word Vo according to the matching operation of the codelength storage unit 721, and a register 724 for storing the desired decoded word Vo from the decoded word storage unit 723 and outputting the decoded word VCD.

The operation of the variable length decoder with the above-mentioned construction in accordance with the embodiment of the present invention will hereinafter be described in detail with reference to FIG. 9. Here, it is assumed that a maximum length of the code is 16 bits.

In the data shifter 700, the input data Vi is sequentially applied to the registers 711 and 712 and the barrel shifter 713. In the barrel shifter 713, the input data Vi and the output data VL0 and VL1 from the registers 711 and 712 are shifted to the left by the accumulated codelength value RS0 from the shift controller 730 and then applied to the register 714. The output data RBS1 from the shifter 714 is applied to the barrel shifter 715 in response to the available code signal VCF from the shift controller 730. In the barrel shifter 715, the output data RBS1 from the shifter 714 is shifted to the left by the previous codelength RLN1 from the shift controller 730 and then temporarily stored in the register 716. The output data BS2 from the barrel shifter 715 stored in the register 716 is applied to the barrel shifter 717 in response to the matching signal MS1 from the decoding circuit 720. In the barrel shifter 717, the output data VL3 from the register 716 is shifted to the left by the previous codelength RLN1 from the shift controller 730.

The output data BS3 from the barrel shifter 717 is fed back thereto through the register 718 and applied to the register 719. Then, the output data RBS3 from the register 719 is applied to the decoding circuit 720.

In the decoding circuit 720, the output data RBS3 from the register 719 is matched with data in a codeword/codelength table of the codelength storage unit 721 on the basis of the previous codelength RLN1 from the shift controller 730. A codeword and the codelength LN1 are detected as a result of the matching operation of the codelength storage unit 721. The detected codeword from the codelength storage unit 721 is decoded by the decoded word storage unit 723 and then the resultant decoded word VLD is outputted through the register 724. The detected codelength LN1 from the codelength storage unit 721 is applied to the register 731 in the shift controller 730. The matching detector 722 discriminates whether the output data RBS3 from the register 719 is matched within 16 bits.

The decoding circuit 720 includes a PLA comprised of broken flag data. The flag data contains flag information indicating whether the output data RBS3 from the register 719 is a code within 16 bits. The output data RBS3 from the register 719 is shifted to the left in the decoding circuit 720 in such a manner that the previous data bits are stored as high-order bits and new data bits are stored as low-order bits.

Upon receiving the output data RBS3 from the register 719 together with a 5-bit output or the previous codelength RLN1 from the shift controller 730, the decoding circuit 720 excepts the high-order bits of the number corresponding to the previous codelength RLN1 from the data RBS3 and performs the matching operation beginning with the highest-order bit of the remaining bits. The codelength and decoded word matched in this manner are applied to the registers 731 and 724, respectively. At this time, if the matching signal MS1 is "1", this means that the matching is established. On the contrary, if the matching signal MS1 is "0", this means that the matching is not established.

In the shift controller 730, the matching signal MS1 from the decoding circuit 720 is latched by the flip-flop 732 and then outputted as the available code signal VCF therefrom, so as to indicate that the data stored in the register 724 is a normally decoded word. The available code signal VCF from the flip flop 732 is inverted by the inverter 735 and then applied as a latch enable signal to the register 736, thereby causing the register 736 to latch the output of the adder 734.

On the other hand, the previous codelength RLN1 from the register 731 is added to the matched codelength of the output data RBS3 from the data shifter 700 and the added value is fed as the current codelength LN1 back to the register 731. The resultant previous codelength RLN1 from the register 731 is then applied to the barrel shifters 715 and 717 in the data shifter 700, which thus shift the data to the left by the resultant previous codelength RLN1.

In the case where the matching signal MS1 from the decoding circuit 720 is set to the broken flag, the values of the registers 714, 716, 718 and 719 in the data shifter 700 are updated into new values and the value of the register 733 in the shift controller 730 is updated after one clock.

The adder 734 adds the output data RLN1 and RR5 from the registers 731 and 733 and outputs the added data to the register 736 and the registers 711 and 712 in the data shifter 700. At this time, the register 736 inputs the output of the adder 734 when being enabled by the output of the inverter 735.

A carry may be generated in the adder 734 and then outputted as the ready signal RDY therefrom. The ready signal RDY indicates that the devices are ready to input the next data. Thereafter, new data Vi is stored into the registers 711 and 712 in the data shifter 700 in response to the next clock signal. Also, the registers 711, 712, 714, 716, 718, 719, 724, 731, 733 and 736 and the flip-flop 732 are operated in response to the same clock signal.

In the preferred embodiment of the present invention, it is assumed that the output data of the 16-bit register 719 has the maximum codelength. But, provided that the maximum codelength is n and m≧n, each of the input data Vi, the output data of the registers 719, 711, 712, 716 and 718 and the output data of the decoded word storage unit 723 and the output data of the barrel shifters 717 and 715 may be m bits and each of the output data of the barrel shifter 713 and the register 714 may be 2m bits. Also, each of the output data RLN1 and LN1 of the register 731 and the codelength storage unit 721 may be (L+1) bits, in which L+1 is an integer and L≧log2m. Further, each of the output data RS0, RR5 and S0 of the registers 736 and 733 and the adder 734 may be L bits.

The decoding circuit 720 performs the decoding operation for the m-bit output data RBS3 from the register 719 beginning with the highest-order bit thereof. In the decoding operation, the decoding circuit 720 reads a length of the first code of the m-bit output data RBS3 from the register 719 and outputs the read codelength to the register 731, which then feeds the stored codelength RLN1 back to the decoding circuit 720. Then, the decoding circuit 720 reads a length of the second code of the m-bit output data RBS3 from the register 719. The read length of the second code is added to the first codelength and the added value is applied to the register 731.

The above feedback operation is continuously performed until the broken flag is generated in the decoding circuit 720. Namely, the codes of the m-bit output data RBS3 from the register 719 are all decoded by repeatedly performing the above feedback operation until the broken flag is generated in the decoding circuit 720. Therefore, the time as much as a codetable matching cycle is required in decoding one code. This makes the high-speed decoding possible.

On the other hand, when the broken flag is generated in the decoding circuit 720, the remaining bits other than the decoded bits and bits to be newly decoded are arranged and the above feedback operation is repeatedly performed for the arranged bits. In this case, the register 731 is reset to "0" in response to the matching signal MS1 and the reset value thereof is applied to the decoding circuit 720 together with the arranged data RBS3 from the register 719.

The above-mentioned operation of the variable length decoder in accordance with the embodiment of the present invention will hereinafter be described in more detail with reference to the data flowcharts of FIGS. 10A–10J.

At a moment t=2 under the condition that the elements have data as shown in FIG. 10A at a moment t=1, respectively, the data VL1, VL0, Vi, BS1 and RBS1 have no variation because of the absence of the ready signal RDY, the data RS0 and the available code signal. The output data BS2 of the barrel shifter 715 is shifted by 10 because the data LN1 is "01010" at the moment t=1. The data VL4 and VL3 have no variation because the matching signal MS1 is 0 at the moment t=1. The data BS3 is shifted by the data RLN1 at the moment t=1. The data RBS3 has no variation because the matching signal MS1 is 0 at the moment t=1. Since the matching is not established due to the broken state of the subsequent data B from the register 719, the data LN1 becomes a don't care state of XXXXX. The matching signal MS1 becomes 1 because the matching is established for 10 bits of the first data A from the register 719. The data Vo becomes a don't care state of X resulting from the don't care state of the data LN1. The data LN1 of "1010" at the moment t=1 appears at the data RS0 through the adder 734 and the register 736. The matched first data A appears at the data VCD.

At a moment t=3, the data VL1, VL0 and Vi have still no variation because of no generation of the ready signal RDY. The output data BS1 of the barrel shifter 713 is shifted by 10 because the data RS0 is "1010" at the moment t=2. The data RBS1 has still no variation. The data BS2 and BS3 become don't care states resulting from a don't care state of the data RLN1 at the moment t=2. Since the data A was previously matched, a value shifted by the data A appears at the data VL4 and VL3. Similarly, data except the data A appears at the data RBS3. A length (01000) of the data B appears at the data LN1. The matching signal MS1 becomes 0 because no matching is established. The data B appears at the data Vo. The data RS0 maintains the previous value (1010) due to the don't care state of the data LN1 the moment t=2. The value X of the data Vo at the moment t=2 appears at the data VCD.

The above operation is repeatedly performed in such a manner that one data is decoded every two clock signals when its length is long, whereas every one clock when its length is short.

Figure 11:
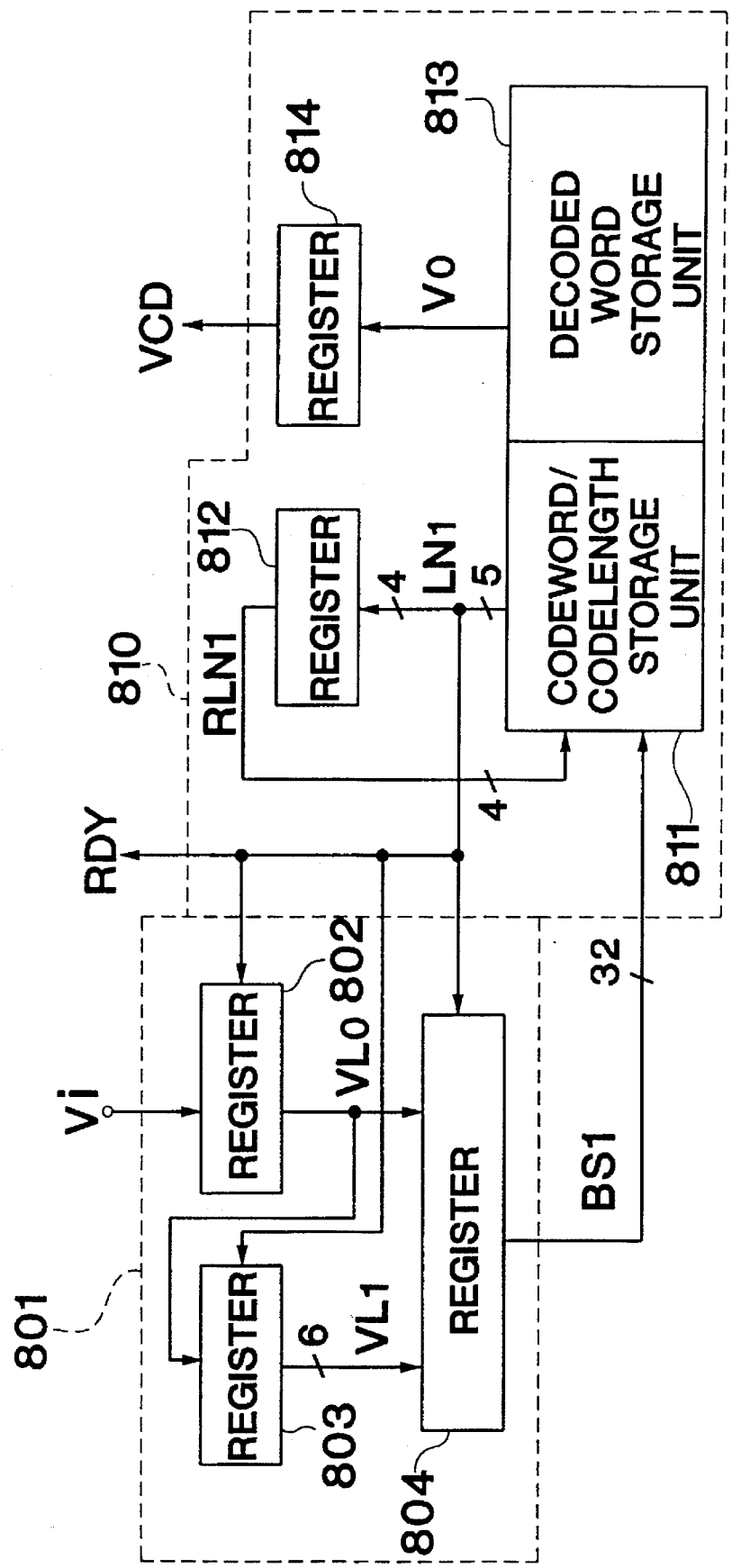
FIG. 11 is a block diagram of an alternative embodiment of the variable length decoder in accordance with the present invention.

Referring to FIG. 11, there is shown a block diagram of an alternative embodiment of the variable length decoder in accordance with the present invention. As shown in this drawing, the variable length decoder comprises a data shifter 801 for shifting input data Vi in response to a ready signal RDY, and a decoding circuit 810 for detecting a current codelength LN1 from output data BS1 from the data shifter 801 on the basis of a previous codelength RLN1, outputting a most significant bit of the detected current codelength LN1 as the ready signal RDY to the data shifter 801 and decoding the output data BS1 from the data shifter 801 on the basis of the previous codelength RLN1 to output a decoded word VCD.

The data shifter 801 includes registers 802 and 803 for storing sequentially the input data Vi in response to the ready signal RDY from the decoding circuit 810, and a register 804 for storing output data VL0 and VL1 from the registers 802 and 803 in response to the ready signal RDY from the decoding circuit 810 and outputting the stored data to the decoding circuit 810.

The decoding circuit 810 includes a codeword/codelength storage unit 811 for matching the output data BS1 from the data shifter 801 with data stored therein on the basis of the previous codelength RLN1, adding a matched codelength to the previous codelength RLN1 and outputting the added value as the current codelength LN1, a decoded word storage unit 813 for outputting a desired decoded word Vo according to the matching operation of the codeword/codelength storage unit 811, a register 814 for storing the desired decoded word Vo from the decoded word storage unit 813 and outputting the decoded word VCD, and a register 812 for storing the current codelength LN1 from the codeword/codelength storage unit 811 and feeding the stored codelength as the previous codelength RLN1 back to the codeword/codelength storage unit 811.

The operation of the variable length decoder with the above-mentioned construction in accordance with the alternative embodiment of the present invention will hereinafter be described in detail with reference to FIG. 11.

In the data shifter 801, the input data Vi is stored into the register 802 in the unit of 16 bits and then loaded into the register 803 in response to the next clock signal. Then, new input data is applied to the register 802. The output data VL0 and VL1 from the registers 802 and 803 are temporarily stored into the register 804 and then applied as the 32-bit code data BS1 to the decoding circuit 810.

In the decoding circuit 810, the output data BS1 from the register 804 in the data shifter 801 and the previous codelength RLN1 from the register 812 are applied to the codeword/codelength storage unit 811. The codeword/codelength storage unit 811 excepts high-order bits of the number corresponding to the previous codelength RLN1 from the data BS1 and performs the matching operation beginning with the highest-order bit of the remaining bits. The matched codelength is added to the previous codelength RLN1 from the register 812 and the added value is applied as the current codelength LN1 to the register 812. The decoded word storage unit 813 outputs the desired decoded word Vo to the register 814 according to the matching operation of the codeword/codelength storage unit 811.

Then, the output data LN1 from the codeword/codelength storage unit 811 and the output data Vo from the decoded word storage unit 813 are loaded into the registers 812 and 814 and outputted as the previous codelength RLN1 and the decoded word VCD therefrom in response to the clock signal, respectively. Then, the output data RLN1 from the register 812 and the output data BS1 from the data shifter 801 are applied to the codeword/codelength storage unit 811 in response to the next clock signal. In this manner, the decoding operation is repeatedly performed.

When the output data LN1 from the codeword/codelength storage unit 811 exceeds 16 during the decoding operation, a most significant bit of 5 bits thereof is set to "1", resulting in generation of the ready signal RDY. The generated ready signal RDY causes new data to be loaded into the registers 802, 803 and 804 in the data shifter 801.

The above-mentioned operation of the variable length decoder in accordance with the alternative embodiment of the present invention will hereinafter be described in more detail with reference to the data flowcharts of FIGS. 12A–12F.

At a moment t=2 under the condition that the elements have data as shown in FIG. 12A at a moment t=1, respectively, the data VL1, VL0 and BS1 have no variation because of the absence of the ready signal RDY. A codelength (0110) of data A appears at the data RLN1. The data LN1 becomes a value (01010) obtained by adding a codelength of data B to the codelength (0110) of the data A. The matched data B appears at the data Vo.

At a moment t=3, the data VL1, VL0 and BS1 have still no variation because of no generation of the ready signal RDY. Namely, the ready signal RDY is not generated since a most significant bit of the data LN1 of "01010" is not "1". The value (1010) of the data LN1 at the moment t=2 appears at the data RLN1. The data RLN1 of "1010" is added to a codelength (0100) of data C obtained by performing the matching operation for bits of the data BS1 except bits of the number corresponding to the data RLN1 of "1010", and then the added value (01110) appears at the data LN1. The matched data C appears at the data Vo.

In the alternative embodiment of the present invention, provided that the codelength is m, each of the output data VL0 and VL1 from the registers 802 and 803 is m bits and the output data BS1 from the register 804 is 2m bits. Also, the output data LN1 from the codeword/codelength storage unit 811 is (L+1) bits, where L≧2 log2m.

As apparent from the above description, according to the present invention, the variable length decoder performs the matching operation for the remaining bits of the data except bits of the number corresponding to the previously decoded length. Therefore, in the decoding operation, there can be removed a delay time required in arranging the remaining bits beginning with the highest-order bit and performing the matching operation for the arranged bits. This has the effect of performing the decoding operation at a high speed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A variable length coder comprising:
   a plurality of shifting means, each of said plurality of shifting means inputting a corresponding one of a plurality of codewords and a plurality of codelengths, rotating the corresponding codeword by a desired length for interconnection of the codewords and outputting masking bits designating a position of the corresponding codeword to be rotated;

first ORing means for ORing output codewords from said plurality of shifting means;

second ORing means for ORing output masking bits from said plurality of shifting means;

word/mask register means for latching output codeword bits from said first ORing means when corresponding output masking bits from said second ORing means are enabled to "1"; and memory means for storing an output of said word/mask register means and outputting variable length-coded data.

2. A variable length coder as set forth in claim 1, wherein each of said plurality of shifting means includes:

interface means for inputting the plurality of codelengths to control a shifting amount;

an adder for adding output data from said interface means and a previously accumulated codelength value;

a decoder for decoding output data from said adder;

a barrel rotator for rotating the corresponding codeword according to output data from said decoder and outputting the rotated codeword to said first ORing means; and a programmed logic array for obtaining the masking bits by setting bits of the number corresponding to a corresponding one of the plurality of codelengths to "1" and rotating the resultant bits by output data from said decoder, and outputting the obtained masking bits to said second ORing means.

3. A variable length coder as set forth in claim 2, wherein said interface means is constructed to apply a part of the inputted codelengths directly to said adder, delay the remaining codelengths for a predetermined time period and apply the delayed codelengths to said adder.

4. A variable length coder as set forth in claim 1, wherein said word/mask register means includes:

at least one latch means being enabled in response to the masking bits from the said second ORing means to latch the masking bits from said second ORing means and the codeword bits from said first ORing means;

at least one bit set state discrimination means for ANDing first output data bits from said at least one latch means and discriminating a masking bit set state in accordance with the ANDed result;

at least one reset signal generation means for generating a reset signal in response to output data from said at least one bit set state discrimination means and outputting the generated reset signal to said at least one latch means;

flag generation means for ORing the output data from said at least one bit set state discrimination means, latching the ORed result and outputting the latched result as an available code flag; and a multiplexer for selectively outputting second output data bits from said at least one latch means in response to the output data from said at least one bit set state discrimination means.

5. A variable length coder as set forth in claim 4, wherein said at least one latch means includes:

a plurality of latches, each of said plurality of latches being enabled in response to a corresponding one of the masking bits from said second ORing means to latch a corresponding one of the codeword bits from said first ORing means and the corresponding masking bit from said second ORing means synchronously with a clock signal.

6. A variable length coder as set forth in claim 5, wherein each of said plurality of latches includes:

a plurality of flip-flops being enabled in response to the corresponding masking bit from said second ORing means to latch the corresponding codeword bit from said first ORing means and the corresponding masking bit from said second ORing means synchronously with the clock signal, respectively.

7. A variable length coder as set forth in claim 4, wherein said at least one bit set state discrimination means includes:

an AND gate for ANDing the first output data bits from said at least one latch means.

8. A variable length coder as set forth in claim 4, wherein said at least one reset signal generation means includes:

a flip-flop for latching the output data from said at least one bit set state discrimination means; and an AND gate for ANDing output data from said flip-flop and the output data from said at least one bit set state discrimination means.

9. A variable length coder as set forth in claim 4, wherein said flag generation means includes:

an OR gate for ORing the output data from said at least one bit set state discrimination means; and a flip-flop for latching an output signal from said OR gate and outputting the latched signal as the available code flag.

10. A variable length decoder comprising:

data shifting means for shifting input data in response to a previous codelength and a matching signal;

decoding means for inputting output data from said data shifting means and the previous codelength, discriminating a matched state of the inputted data on the basis of the previous codelength, generating a current codelength, the matching signal and a decoded word in accordance with the discriminated result and outputting the generated matching signal to said data shifting means; and shift control means for controlling a shifting amount of said data shifting means in response to the current codelength and the matching signal from said decoding means and outputting the previous codelength to said data shifting means and said decoding mans;

wherein said data shifting means includes:

first and second registers for storing sequentially the input data in response to a ready signal from said shift control means;

a first barrel shifter for shifting output data from said first and second registers and the input data by an accumulated codelength value from said shift control means;

a third register for storing and outputting output data from said first barrel shifter in response to an available code signal from said shift control means;

a second barrel shifter for shifting output data from said third register by the previous codelength from said shift control means;

a fourth register for storing and outputting output data from said second barrel shifter in response to the matching signal from said decoding means;

a third barrel shifter for shifting output data from said fourth register and output data from a fifth register by the previous codelength from said shift control means, said fifth register storing temporarily output data from said third barrel shifter and feeding the stored data back to said third barrel shifter in response to the matching signal from said decoding means; and a sixth register for outputting the output data from said third barrel shifter to said decoding means in response to the matching signal from said decoding means.

11. A variable length decoder comprising:

data shifting means for shifting input data in response to a previous codelength and a matching signal;

decoding means for inputting output data from said data shifting means and the previous codelength, discriminating a matched state of the inputted data on the basis of the previous codelength, generating a current codelength, the matching signal and a decoded word in accordance with the discriminated result and outputting the generated matching signal to said data shifting means; and shift control means for controlling a shifting amount of said data shifting means in response to the current codelength and the matching signal from said decoding means and outputting the previous codelength to said data shifting means and said decoding means;

wherein said decoding means includes:

a codelength storage unit for matching the output data from said data shifting means with data stored therein on the basis of the previous codelength from said shift control means and outputting the current codelength to said shift control means in accordance with the matched result;

a matching detector for generating the matching signal according to the matching operation of said codelength storage unit and outputting the generated matching signal to said data shifting means and said shift control means;

a decoded word storage unit for outputting the decoded word according to the matching operation of said codelength storage unit; and a register for storing the decoded word from said decoded word storage unit.

12. A variable length decoder comprising:

data shifting means for shifting input data in response to a previous codelength and a matching signal;

decoding means for inputting output data from said data shifting means and the previous codelength, discriminating a matched state of the inputted data on the basis of the previous codelength, generating a current codelength, the matching signal and a decoded word in accordance with the discriminated result and outputting the generated matching signal to said data shifting means; and shift control means for controlling a shifting amount of said data shifting means in response to the current codelength and the matching signal from said decoding means and outputting the previous codelength to said data shifting means and said decoding means;

wherein said shift control means includes:

a first register for storing the current codelength from said decoding means and outputting the stored codelength as the previous codelength to said data shifting means and said decoding means;

a flip-flop for latching the matching signal from said decoding means and outputting the latched signal as an available code signal to said data shifting means;

an inverter for inverting the available code signal from said flip-flop;

a second register for storing temporarily an accumulated codelength value in response to the available code signal from said flip-flop;

an adder for adding the previous codelength from said first register and output data from said second register and outputting the added value as a ready signal and a sum signal, the ready signal being applied to said data shifting means; and a third register for storing the sum signal from said adder and outputting the stored signal as the accumulated codelength value to said data shifting means and said second register in response to an output signal from said inverter.

13. A variable length decoder comprising:

data shifting means for shifting input data in response to a ready signal; and decoding means for detecting a current codelength from output data from said data shifting means on the basis of a previous codelength, outputting a most significant bit of the detected current codelength as the ready signal to said data shifting means and decoding the output data from said data shifting means on the basis of the previous codelength to output a decoded word;

wherein said data shifting means includes:

first and second registers for storing sequentially the input data in response to the ready signal from said decoding means; and a third register for shifting output data from said first and second registers in response to the ready signal from said decoding means and outputting the shifted data to said decoding means.

14. A variable length decoder comprising:

data shifting means for shifting input data in response to a ready signal; and decoding means for detecting a current codelength from output data from said data shifting means on the basis of a previous codelength, outputting a most significant bit of the detected current codelength as the ready signal to said data shifting means and decoding the output data from said data shifting means on the basis of the previous codelength to output a decoded word;

wherein said decoding means includes:

a codeword/codelength storage unit for matching the output data from said data shifting means with data stored therein on the basis of the previous codelength, adding a matched codelength to the previous codelength and outputting the added value as the current codelength;

a decoded word storage unit for outputting the decoded word according to the matching operation of said codeword/codelength storage unit;

a first register for storing the decoded word from said decoded word storage unit; and a second register for storing the current codelength from said codeword/codelength storage unit and feeding the stored codelength as the previous codelength back to said codeword/codelength storage unit.

15. A variable length decoder, comprising:

data shifting means for shifting input data in response to a previous codelength and a matching signal inputted thereto;

decoding means for inputting the previous codelength and shifted data from said data shifting means, discriminating a matched state of the inputted data on the basis of the previous codelength, generating a current codelength, the matching signal and a decoded word in accordance with the discriminated result of the matched state, and outputting the generated matching signal to said data shifting means; and shift control means for controlling a shifting amount of said data shifting means by outputting the previous codelength to said data shifting means when the current codelength is not matched, and operating the decoding means repeatedly when the current codelength is matched.

* * * * *